(12) United States Patent
Takahashi et al.

(10) Patent No.: US 12,391,881 B2
(45) Date of Patent: Aug. 19, 2025

(54) METHOD FOR PRODUCING OPTICALLY ANISOTROPIC LAYER, METHOD FOR PRODUCING LAMINATE, METHOD FOR PRODUCING OPTICALLY ANISOTROPIC LAYER WITH POLARIZER, METHOD FOR PRODUCING LAMINATE WITH POLARIZER, COMPOSITION, AND OPTICALLY ANISOTROPIC LAYER

(71) Applicant: FUJIFILM Corporation, Tokyo (JP)

(72) Inventors: Yuta Takahashi, Kanagawa (JP); Shinpei Yoshida, Kanagawa (JP); Satoshi Yanokuchi, Kanagawa (JP); Akira Maruyama, Kanagawa (JP); Keisuke Kodama, Kanagawa (JP); Yuta Fukushima, Kanagawa (JP); Shunya Katoh, Kanagawa (JP); Yuki Fukushima, Kanagawa (JP); Hiroyuki Hagio, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 855 days.

(21) Appl. No.: 17/670,878

(22) Filed: Feb. 14, 2022

(65) Prior Publication Data
US 2022/0171109 A1 Jun. 2, 2022

Related U.S. Application Data

(63) Continuation of application No. PCT/JP2020/030838, filed on Aug. 14, 2020.

(30) Foreign Application Priority Data

Aug. 16, 2019 (JP) .................................. 2019-149419
Sep. 26, 2019 (JP) .................................. 2019-175987
(Continued)

(51) Int. Cl.
*G02B 5/30* (2006.01)
*C09K 19/38* (2006.01)
(Continued)

(52) U.S. Cl.
CPC ............ *C09K 19/586* (2013.01); *C09K 19/38* (2013.01); *G02B 5/3016* (2013.01); *G02B 5/305* (2013.01);
(Continued)

(58) Field of Classification Search
CPC ........................... G02B 5/3016; C09K 19/586
See application file for complete search history.

(56) References Cited

U.S. PATENT DOCUMENTS 12,124,144 B2 * 10/2024 Yoshida ............... G02B 5/3016
2014/0284583 A1    9/2014 Saitoh et al.
(Continued)

FOREIGN PATENT DOCUMENTS

JP    2002-328229 A    11/2002
JP    2004-125841 A    4/2004
(Continued)

OTHER PUBLICATIONS

International Search Report issued in PCT/JP2020/030838 on Oct. 27, 2020.
(Continued)

*Primary Examiner* — Joseph L Williams
(74) *Attorney, Agent, or Firm* — Edwards Neils LLC; Jean C. Edwards, Esq.

(57) ABSTRACT

Provided is a method for producing an optically anisotropic layer, with a polarizer, which has a plurality of regions in which alignment states of a liquid crystal compound are fixed and different from one another; laminate, with a polarizer; and a composition. The method includes: 1) forming a composition layer containing a chiral agent con-
(Continued)

taining at least a photosensitive chiral agent and a polymerizable liquid crystal compound on a substrate, 2) subjecting the composition layer to a heat treatment, 3) subjecting the composition layer to light irradiation under oxygen concentration of 1% by volume or more, after step 2), and 4) subjecting the composition layer to a curing treatment to form an optically anisotropic layer, and 5) carrying out step 3) under heating conditions, or subjecting the composition layer to a heat treatment between step 3) and step 4), with a predetermined amount of chiral agent.

20 Claims, 5 Drawing Sheets

(30) Foreign Application Priority Data

| | | |
|---|---|---|
| Sep. 27, 2019 | (JP) | 2019-177831 |
| Dec. 26, 2019 | (JP) | 2019-237279 |
| Jun. 1, 2020 | (JP) | 2020-095459 |
| Jun. 22, 2020 | (JP) | 2020-107171 |
| Aug. 4, 2020 | (JP) | 2020-132394 |

(51) Int. Cl.
  *C09K 19/58* (2006.01)
  *C09K 19/04* (2006.01)
  *H10K 59/80* (2023.01)

(52) U.S. Cl.
  CPC .... *G02B 5/3083* (2013.01); *C09K 2019/0448* (2013.01); *H10K 59/8791* (2023.02)

(56) References Cited

U.S. PATENT DOCUMENTS

| | | |
|---|---|---|
| 2018/0239177 A1 | 8/2018 | Oh |
| 2020/0102500 A1 | 4/2020 | Kodama et al. |
| 2020/0225387 A1* | 7/2020 | Ishiguro .................. C08F 20/30 |
| 2022/0204855 A1* | 6/2022 | Kodama ............ C09K 19/2007 |
| 2023/0225176 A1* | 7/2023 | Kuwayama ............ H05B 33/02 257/40 |
| 2025/0044481 A1* | 2/2025 | Ueki ........................ G02B 1/08 |

FOREIGN PATENT DOCUMENTS

| | | | |
|---|---|---|---|
| JP | 2004-258623 | A | 9/2004 |
| JP | 2006-072273 | A | 3/2006 |
| JP | 2014-209219 | A | 11/2014 |
| JP | 5960743 | B2 | 8/2016 |
| JP | 2017-037151 | A | 2/2017 |
| JP | 2017-102259 | A | 6/2017 |
| KR | 10-2019-0040330 | A | 4/2019 |
| WO | 2019/013284 | A1 | 1/2019 |
| WO | 2019/142707 | A1 | 7/2019 |

OTHER PUBLICATIONS

Written Opinion issued in PCT/JP2020/030838 on Oct. 27, 2020.
International Preliminary Report on Patentability completed by WIPO on Feb. 17, 2022 in connection with International Patent Application No. PCT/JP2020/030838.
Office Action, which was issued by the Japanese Patent Office on Aug. 29, 2023, in connection with Japanese Patent Application No. 2021-540756.
Office Action, which was issued by the Korean Intellectual Property Office on Feb. 29, 2024, in connection with Korean Patent Application No. 10-2020-7004247.
Office Action, which was issued by the Japanese Patent Office on Mar. 7, 2023, in connection with Japanese Patent Application No. 2021-540756.
Office Action, which was issued by the China National Intellectual Property Administration on Jan. 1, 2024, in connection with Chinese Patent Application No. 202080057585.4.
Office Action, which was issued by the Korean Intellectual Property Office on Nov. 29, 2024, in connection with Korean Patent Application No. 10-2022-7004247.

* cited by examiner

METHOD FOR PRODUCING OPTICALLY ANISOTROPIC LAYER, METHOD FOR PRODUCING LAMINATE, METHOD FOR PRODUCING OPTICALLY ANISOTROPIC LAYER WITH POLARIZER, METHOD FOR PRODUCING LAMINATE WITH POLARIZER, COMPOSITION, AND OPTICALLY ANISOTROPIC LAYER

CROSS-REFERENCE TO RELATED APPLICATIONS

This application is a Continuation of PCT International Application No. PCT/JP2020/030838 filed on Aug. 14, 2020, which was published under PCT Article 21 (2) in Japanese, and which claims priority under 35 U.S.C. § 119 (a) to Japanese Patent Application No. 2019-149419 filed on Aug. 16, 2019, Japanese Patent Application No. 2020-095459 filed on Jun. 1, 2020, Japanese Patent Application No. 2019-177831 filed on Sep. 27, 2019, Japanese Patent Application No. 2019-175987 filed on Sep. 26, 2019, Japanese Patent Application No. 2019-237279 filed on Dec. 26, 2019, Japanese Patent Application No. 2020-107171 filed on Jun. 22, 2020 and Japanese Patent Application No. 2020-132394 filed on Aug. 4, 2020. The above applications is are hereby expressly incorporated by reference, in their entirety, into the present application.

BACKGROUND OF THE INVENTION

1. Field of the Invention

The present invention relates to a method for producing an optically anisotropic layer, a method for producing a laminate, a method for producing an optically anisotropic layer with a polarizer, a method for producing a laminate with a polarizer, a composition, and an optically anisotropic layer.

2. Description of the Related Art

A retardation layer having refractive index anisotropy (optically anisotropic layer) is applied to various applications such as an antireflection film of a display device and an optical compensation film of a liquid crystal display device.

A laminated type optically anisotropic layer consisting of a plurality of layers as described in JP5960743B is disclosed as the optically anisotropic layer.

SUMMARY OF THE INVENTION

Conventionally, in a case where an optically anisotropic layer as described in JP5960743B is produced, the optically anisotropic layer to be laminated is formed by coating for each layer, and this leads to a problem that the productivity is low and the cost is high.

In addition, an optically anisotropic layer which has, in a thickness direction, a plurality of regions where alignment states of a liquid crystal compound are different from one another and in which peeling is unlikely to occur in the layer has been desired.

In view of the above circumstances, an object of the present invention is to provide a simple method for producing an optically anisotropic layer which has, along a thickness direction, a plurality of regions where alignment states of a liquid crystal compound are fixed and the alignment states of the liquid crystal compound are different from one another.

Another object of the present invention is to provide an optically anisotropic layer which has, in a thickness direction, has a plurality of regions where alignment states of a liquid crystal compound are different from one another and in which peeling is unlikely to occur in the layer.

Another object of the present invention is to provide a method for producing a laminate, a method for producing an optically anisotropic layer with a polarizer, a method for producing a laminate with a polarizer, and a composition.

As a result of extensive studies on the problems of the related art, the present inventors have found that the foregoing objects can be achieved by the following configurations.

(1) A method for producing an optically anisotropic layer having:
- a step 1 of forming a composition layer containing a chiral agent containing at least a photosensitive chiral agent whose helical twisting power changes upon irradiation with light and a liquid crystal compound having a polymerizable group on a substrate;
- a step 2 of subjecting the composition layer to a heat treatment to align the liquid crystal compound in the composition layer;
- a step 3 of subjecting the composition layer to light irradiation under a condition of an oxygen concentration of 1% by volume or more, after the step 2; and
- a step 4 of subjecting the light-irradiated composition layer to a curing treatment to fix an alignment state of the liquid crystal compound to form an optically anisotropic layer having a plurality of regions having different alignment states of the liquid crystal compound along a thickness direction, and
- further having a step 5 of carrying out the step 3 under heating conditions, or subjecting the composition layer to a heat treatment between the step 3 and the step 4,
- in which a total content of the chiral agent with respect to a total mass of the liquid crystal compound is 5.0% by mass or less.

(2) The method for producing an optically anisotropic layer according to (1), in which the total content of the chiral agent with respect to the total mass of the liquid crystal compound is 1.0% by mass or less.

(3) The method for producing an optically anisotropic layer according to (1) or (2), in which the composition layer contains two or more chiral agents, and an absolute value of a weighted average helical twisting power of the two or more chiral agents in the composition layer in the step 1 is 0.0 to 0.5 $\mu m^{-1}$.

(4) The method for producing an optically anisotropic layer according to (3), in which the optically anisotropic layer has, along a thickness direction, a first region in which the alignment state of the liquid crystal compound twist-aligned along a helical axis extending along a thickness direction is fixed, and a second region in which the alignment state of a homogeneously aligned liquid crystal compound is fixed.

(5) The method for producing an optically anisotropic layer according to any one of (1) to (4), in which an irradiation amount of light irradiation in the step 3 is 300 $mJ/cm^2$ or less.

(6) The method for producing an optically anisotropic layer according to any one of (1) to (5), in which the photosensitive chiral agent whose helical twisting power changes upon irradiation with light has a partial structure of any one of a binaphthyl partial structure, an isosorbide partial structure, or an isomannide partial structure.

(7) The method for producing an optically anisotropic layer according to any one of (1) to (6), in which the photosensitive chiral agent whose helical twisting power changes upon irradiation with light has a photoisomerizable double bond.

(8) A method for producing a laminate, including laminating an optically anisotropic layer obtained by the production method according to any one of (1) to (7) and a C-plate to obtain a laminate.

(9) A method for producing an optically anisotropic layer with a polarizer, including laminating an optically anisotropic layer obtained by the production method according to any one of (1) to (7) and a polarizer to obtain an optically anisotropic layer with a polarizer.

(10) A method for producing a laminate with a polarizer, including laminating a laminate obtained by the production method according to (8) and a polarizer to obtain a laminate with a polarizer.

(11) A composition including a chiral agent containing at least a photosensitive chiral agent whose helical twisting power changes upon irradiation with light and a liquid crystal compound having a polymerizable group, in which a total content of the chiral agent with respect to a total mass of the liquid crystal compound is 5.0% by mass or less.

(12) The composition according to (11), in which the composition contains two or more chiral agents, and an absolute value of a weighted average helical twisting power of the two or more chiral agents is 0.0 to 0.5 $\mu m^{-1}$.

(13) An optically anisotropic layer formed of a liquid crystal compound,
  in which the optically anisotropic layer contains a leveling agent,
  in a case where components of the optically anisotropic layer in a depth direction are analyzed by time-of-flight secondary ion mass spectrometry while irradiating the optically anisotropic layer with an ion beam from one surface to the other surface of the optically anisotropic layer, a profile of a secondary ion intensity derived from the leveling agent in a depth direction is obtained, a higher secondary ion intensity derived from the leveling agent, out of a secondary ion intensity derived from the leveling agent on the one surface of the optically anisotropic layer and a secondary ion intensity derived from the leveling agent on the other surface of the optically anisotropic layer, is defined as a first intensity,
  the secondary ion intensity which is 1/1000 of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of 1/500 or more of the first intensity is observed at any depth of a region between the first position and the second position, and
  the optically anisotropic layer satisfies the following requirement 1 or 2.

Requirement 1: The optically anisotropic layer has, along a thickness direction, a region in which an alignment state of the liquid crystal compound twist-aligned along a helical axis extending along a thickness direction is fixed, and a region in which an alignment state of a homogeneously aligned liquid crystal compound is fixed.

Requirement 2: The optically anisotropic layer has, along a thickness direction, a plurality of regions in which the alignment state of the liquid crystal compound twist-aligned along a helical axis extending along a thickness direction is fixed, and twisted angles of liquid crystal compounds in the plurality of regions are different from each other.

According an aspect of the present invention, it is possible to provide a simple method for producing an optically anisotropic layer which has, along a thickness direction, a plurality of regions where alignment states of a liquid crystal compound are fixed and the alignment states of the liquid crystal compound are different from one another.

According to another aspect of the present invention, it is possible to provide an optically anisotropic layer which has, in a thickness direction, has a plurality of regions where alignment states of a liquid crystal compound are different from one another and in which peeling is unlikely to occur in the layer.

According to another aspect of the present invention, it is also possible to provide a method for producing a laminate, a method for producing an optically anisotropic layer with a polarizer, a method for producing a laminate with a polarizer, and a composition.

DESCRIPTION OF THE PREFERRED EMBODIMENTS

Figure 1:
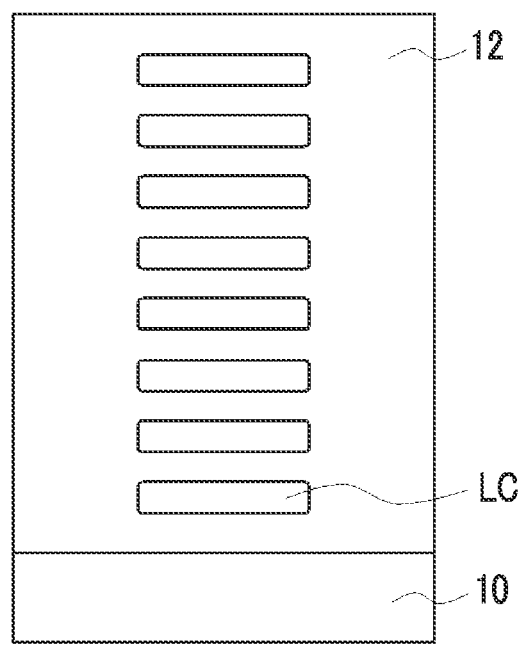
FIG. 1 is a cross-sectional view of a composition layer for explaining an example of a step 1 of the first embodiment of the present invention.

Hereinafter, the present invention will be described in more detail. Any numerical range expressed using "to" in the present specification refers to a range including the numerical values before and after the "to" as a lower limit value and an upper limit value, respectively. First, the terms used in the present specification will be described.

The slow axis is defined at 550 nm unless otherwise specified.

In the present invention, Re ($\lambda$) and Rth ($\lambda$) represent an in-plane retardation and a thickness direction retardation at a wavelength $\lambda$, respectively. Unless otherwise specified, the wavelength $\lambda$ is 550 nm.

In the present invention, Re ($\lambda$) and Rth ($\lambda$) are values measured at a wavelength $\lambda$ in AxoScan (manufactured by Axometrics, Inc.). By inputting an average refractive index ((nx+ny+nz)/3) and a film thickness (d ($\mu$m)) in AxoScan,
slow axis direction (°)

$$Re(\lambda) = R0(\lambda)$$

$$Rth(\lambda) = ((nx+ny)/2 - nz) \times d$$

are calculated.

Although R0 ($\lambda$) is displayed as a numerical value calculated by AxoScan, it means Re ($\lambda$).

In the present specification, the refractive indexes nx, ny, and nz are measured using an Abbe refractometer (NAR-4T, manufactured by Atago Co., Ltd.) and using a sodium lamp ($\lambda$=589 nm) as a light source. In addition, in a case of measuring the wavelength dependence, it can be measured with a multi-wavelength Abbe refractometer DR-M2 (manufactured by Atago Co., Ltd.) in combination with an interference filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Of these, an ultraviolet ray is preferable.

The term "visible light" in the present specification refers to light in a wavelength range of 380 to 780 nm. In addition, the measurement wavelength in the present specification is 550 nm unless otherwise specified.

In the present specification, in a case where the liquid crystal compound is twist-aligned in the optically anisotropic layer, the twisted angle is preferably more than 0° and less than 360°.

The feature point of the method for producing an optically anisotropic layer according to the embodiment of the present invention is that a predetermined amount of a chiral agent containing at least a photosensitive chiral agent whose helical twisting power changes upon irradiation with light is used, and a predetermined step is carried out.

As will be described in detail later, in the present invention, first, the liquid crystal compound in the composition layer is aligned. The oxygen concentration is low in a part of a region of the formed composition layer on the substrate side, and the oxygen concentration is high in the other region on the surface side opposite to the substrate side. Therefore, in a case where such a composition layer is irradiated with light, the polymerization of the liquid crystal compound does not easily proceed in the region where the oxygen concentration is high, and the photosensitive chiral agent whose helical twisting power changes upon irradiation with light is exposed to light and therefore the helical twisting power of the chiral agent changes. Therefore, the alignment state of the liquid crystal compound changes by a subsequent heat treatment. On the other hand, the polymerization of the liquid crystal compound proceeds preferentially in the region where the oxygen concentration is low in the composition layer, and the alignment state of the liquid crystal compound before light irradiation is fixed. As a result, an optically anisotropic layer having a plurality of regions having different fixed alignment states of the liquid crystal compound along a thickness direction is produced.

Hereinafter, suitable aspects of the method for producing an optically anisotropic layer according to the embodiment of the present invention will be described in detail.

First Embodiment

The first embodiment of the method for producing an optically anisotropic layer according to the embodiment of the present invention has the following steps 1 to 5.

Step 1: a step of forming a composition layer containing a chiral agent containing at least a photosensitive chiral agent whose helical twisting power changes upon irradiation with light and a liquid crystal compound having a polymerizable group on a substrate Step 2: a step of subjecting the composition layer to a heat treatment to align the liquid crystal compound in the composition layer Step 3: a step of subjecting the composition layer to light irradiation under a condition of an oxygen concentration of 1% by volume or more, after the step 2

Step 5: a step of subjecting the composition layer to a heat treatment between the step 3 and the step 4 which will be described later Step 4: a step of subjecting the light-irradiated composition layer to a curing treatment to fix an alignment state of the liquid crystal compound to form an optically anisotropic layer having a plurality of regions having different alignment states of the liquid crystal compound along a thickness direction The total content of the chiral agent with respect to the total mass of the liquid crystal compound is 5.0% by mass or less.

Hereinafter, the procedure of each of the above steps will be described in detail.

The first embodiment has the step 5, but as will be described later, it may be an aspect in which the step 3 is carried out under heating conditions without carrying out the step 5.

<Step 1>

The step 1 is a step of forming a composition layer containing a chiral agent containing at least a photosensitive chiral agent whose helical twisting power changes upon irradiation with light and a liquid crystal compound having a polymerizable group on a substrate. Carrying out this step leads to the formation of a composition layer to be subjected to a light irradiation treatment which will be described later.

In the following, first, the materials used in this step will be described in detail, and then the procedure of the step will be described in detail.

(Chiral Agent)

The composition layer of the step 1 contains a chiral agent containing at least a photosensitive chiral agent whose helical twisting power changes upon irradiation with light. First, the photosensitive chiral agent whose helical twisting power changes upon irradiation with light will be described in detail.

The helical twisting power (HTP) of the chiral agent is a factor indicating an helical alignment ability expressed by Expression (X).

$$HTP=1/(\text{length of helical pitch (unit: μm)} \times \text{concentration of chiral agent with respect to liquid crystal compound (\% by mass)})[\text{μm}^{-1}] \quad \text{Expression (X)}$$

The length of the helical pitch refers to a length of pitch P (=helical period) of a helical structure of a cholesteric liquid crystalline phase and can be measured by the method described in Handbook of Liquid Crystals (published by Maruzen Co., Ltd.), p. 196.

The photosensitive chiral agent whose helical twisting power changes upon irradiation with light (hereinafter, also simply referred to as "chiral agent A") may be liquid crystalline or non-liquid crystalline. The chiral agent A generally contains an asymmetric carbon atom in many cases. The chiral agent A may be an axial asymmetric compound or planar asymmetric compound that does not contain an asymmetric carbon atom.

The chiral agent A may be a chiral agent whose helical twisting power increases upon irradiation with light, or may be a chiral agent whose helical twisting power decreases upon irradiation with light. Of these, a chiral agent whose helical twisting power decreases upon irradiation with light is preferable.

The "increase and decrease in helical twisting power" in the present specification represent increase/decrease in helical twisting power in a case where an initial helical direction (helical direction before light irradiation) of the chiral agent A is set to "positive". Accordingly, even in a case where the helical twisting power of a chiral agent continues to decrease and goes below zero upon irradiation with light and therefore the helical direction becomes "negative" (that is, even in a case where a chiral agent induces a helix in a helical direction opposite to an initial helical direction (helical direction before light irradiation)), such a chiral agent also corresponds to the "chiral agent whose helical twisting power decreases".

The chiral agent A may be, for example, a so-called photoreactive chiral agent. The photoreactive chiral agent is a compound which has a chiral site and a photoreactive site that undergoes a structural change upon irradiation with light and which greatly changes a twisting power of a liquid crystal compound according to an irradiation amount, for example.

Examples of the photoreactive site that undergoes a structural change upon irradiation with light include photochromic compounds (Kingo Uchida and Masahiro Irie, "Chemical Industry", Vol. 64, p. 640, 1999; and Kingo Uchida and Masahiro Irie, "Fine Chemicals", Vol. 28(9), p. 15, 1999). In addition, the structural change means decomposition, addition reaction, isomerization, racemization, [2+2] photocyclization, dimerization reaction, or the like occurred upon irradiation of a photoreactive site with light, and the structural change may be irreversible. In addition, the chiral site corresponds to the asymmetric carbon described in Chemistry of Liquid Crystals, No. 22, Hiroyuki Nohira, Chemical Reviews, p. 73, 1994.

Examples of the chiral agent A include photoreactive chiral agents described in paragraphs [0044] to [0047] of JP2001-159709A, optically active compounds described in paragraphs [0019] to [0043] of JP2002-179669A, optically active compounds described in paragraphs [0020] to [0044] of JP2002-179633A, optically active compounds described in paragraphs [0016] to [0040] of JP2002-179670A, optically active compounds described in paragraphs [0017] to [0050] of JP2002-179668A, optically active compounds described in paragraphs [0018] to [0044] of JP2002-180051A, optically active isosorbide derivatives described in paragraphs [0016] to [0055] of JP2002-338575A, photoreactive optically active compounds described in paragraphs [0023] to [0032] of JP2002-080478A, photoreactive chiral agents described in paragraphs [0019] to [0029] of JP2002-080851A, optically active compounds described in paragraphs [0022] to [0049] of JP2002-179681A, optically active compounds described in paragraphs [0015] to [0044] of JP2002-302487A, optically active polyesters described in paragraphs [0015] to [0050] of JP2002-338668A, binaphthol derivatives described in paragraphs [0019] to [0041] of JP2003-055315A, optically active fulgide compounds described in paragraphs [0008] to [0043] of JP2003-073381A, optically active isosorbide derivatives described in paragraphs [0015] to [0057] of JP2003-306490A, optically active isosorbide derivatives described in paragraphs [0015] to [0041] of JP2003-306491A, optically active isosorbide derivatives described in paragraphs [0015] to [0049] of JP2003-313187A, optically active isomannide derivatives described in paragraphs [0015] to [0057] of JP2003-313188A, optically active isosorbide derivatives described in paragraphs [0015] to [0049] of JP2003-313189A, optically active polyesters/amides described in paragraphs [0015] to [0052] of JP2003-313292A, optically active compounds described in paragraphs [0012] to [0053] of WO2018/194157A, and optically active compounds described in paragraphs [0020] to [0049] of JP2002-179682A.

Above all, the chiral agent A is preferably a compound having at least a photoisomerization site, and the photoisomerization site more preferably has a photoisomerizable double bond. The photoisomerization site having a photoisomerizable double bond is preferably a cinnamoyl site, a chalcone site, an azobenzene site, or a stilbene site from the viewpoint that photoisomerization is likely to occur and the difference in helical twisting power before and after light irradiation is large; and more preferably a cinnamoyl site, a chalcone site, or a stilbene site from the viewpoint that the absorption of visible light is small. The photoisomerization site corresponds to the above-mentioned photoreactive site that undergoes a structural change upon irradiation with light.

In addition, the chiral agent A preferably has a trans photoisomerizable double bond from the viewpoint that the initial helical twisting power (helical twisting power before light irradiation) is high and the amount of change in the helical twisting power upon irradiation with light is more excellent.

In addition, the chiral agent A preferably has a cis photoisomerizable double bond from the viewpoint that the initial helical twisting power (helical twisting power before light irradiation) is low and the amount of change in the helical twisting power upon irradiation with light is mom excellent.

The chiral agent A preferably has any partial structure selected from a binaphthyl partial structure, an isosorbide partial structure (a partial structure derived from isosorbide), and an isomannide partial structure (a partial structure derived from isomannide). The binaphthyl partial structure, the isosorbide partial structure, and the isomannide partial structure are intended to have the following structures, respectively.

The portion of the binaphthyl partial structure in which a solid line and a broken line are parallel to each other represents a single bond or a double bond. In the structures shown below, * represents a bonding position.

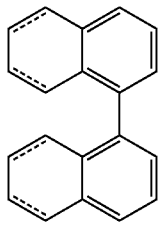 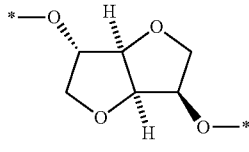

Binaphthyl partial structure

Isosorbide partial structure

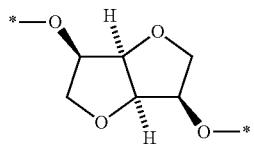

Isomannide partial structure

The chiral agent A may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The chiral agent A is preferably a compound represented by Formula (C).

R-L-R            Formula (C)

R's each independently represent a group having at least one site selected from the group consisting of a cinnamoyl site, a chalcone site, an azobenzene site, and a stilbene site.

L represents a divalent linking group formed by removing two hydrogen atoms from a structure represented by Formula (D) (a divalent linking group formed by removing two hydrogen atoms from the binaphthyl partial structure), a divalent linking group represented by Formula (E) (a divalent linking group consisting of the isosorbide partial structure), or a divalent linking group represented by Formula (F) (a divalent linking group consisting of the isomannide partial structure).

In Formula (E) and Formula (F), * represents a bonding position.

Formula (D)

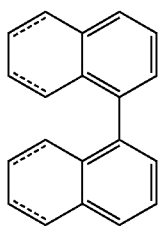

Formula (E)

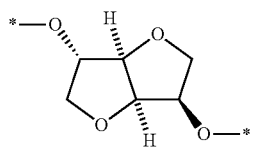

Formula (F)

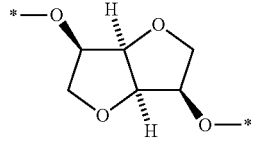

In the step 1, at least the above-mentioned chiral agent A is used. The step 1 may be an aspect in which two or more chiral agents A are used, or may be an aspect in which at least one chiral agent A and at least one chiral agent whose helical twisting power does not change upon irradiation with light (hereinafter, simply referred to as "chiral agent B") are used.

The chiral agent B may be liquid crystalline or non-liquid crystalline. The chiral agent B generally contains an asymmetric carbon atom in many cases. The chiral agent B may be an axial asymmetric compound or planar asymmetric compound that does not contain an asymmetric carbon atom.

The chiral agent B may have a polymerizable group. Examples of the type of the polymerizable group include polymerizable groups that the chiral agent A may have.

A known chiral agent can be used as the chiral agent B.

The chiral agent B is preferably a chiral agent that induces a helix in a direction opposite to the direction of the helix induced by the chiral agent A. That is, for example, in a case where the helix induced by the chiral agent A is right-handed, the helix induced by the chiral agent B is left-handed.

The molar absorption coefficient of each of the chiral agent A and the chiral agent B is not particularly limited. The molar absorption coefficient at a wavelength (for example, 365 nm) of light for irradiation in the step 3 which will be described later is preferably 100 to 100,000 L/(mol·cm) and more preferably 500 to 50,000 L/(mol·cm).

The content of each of the chiral agent A and the chiral agent B in the composition layer can be appropriately set according to the characteristics (for example, retardation and wavelength dispersion) of an optically anisotropic layer to be formed. Since the twisted angle of liquid crystal compound in the optically anisotropic layer largely depends on the types and addition concentrations of the chiral agent A and the chiral agent B, a desired twisted angle can be obtained by adjusting these factors.

The content of the chiral agent A in the composition layer is not particularly limited, and is preferably 5.0% by mass or less, more preferably 3.0% by mass or less, still more preferably 2.0% by mass or less, particularly preferably less than 1.0% by mass, most preferably 0.8% by mass or less, and particularly most preferably 0.5% by mass or less with respect to the total mass of the liquid crystal compound, from the viewpoint that the liquid crystal compound is easily aligned uniformly. The lower limit of the content of the chiral agent A is not particularly limited, and is preferably 0.01% by mass or more, more preferably 0.02% by mass or more, and still more preferably 0.05% by mass or more.

The chiral agent A may be used alone or in combination of two or more thereof. In a case where two or more of the chiral agents A are used in combination, the total content thereof is preferably within the above range.

The content of the chiral agent B in the composition layer is not particularly limited, and is preferably 5.0% by mass or less, more preferably 3.0% by mass or less, still more preferably 2.0% by mass or less, particularly preferably less than 1.0% by mass, most preferably 0.8% by mass or less, and particularly most preferably 0.5% by mass or less with respect to the total mass of the liquid crystal compound, from the viewpoint that the liquid crystal compound is easily aligned uniformly. The lower limit of the content of the chiral agent B is not particularly limited, and is preferably 0.01% by mass or more, more preferably 0.02% by mass or more, and still more preferably 0.05% by mass.

The chiral agent B may be used alone or in combination of two or more thereof. In a case where two or more of the chiral agents B are used in combination, the total content thereof is preferably within the above range.

The total content of the chiral agent (total content of all chiral agents) in the composition layer is 5.0% by mass or less with respect to the total mass of the liquid crystal compound. Above all, the total content of the chiral agent is preferably 4.0% by mass or less, more preferably 2.0% by mass or less, and still more preferably 1.0% by mass or less, from the viewpoint that the effect of the present invention is more excellent. The lower limit of the total content of the chiral agent is not particularly limited, and is preferably 0.01% by mass or more, more preferably 0.02% by mass or more, and still more preferably 0.05% by mass or more.

(Liquid Crystal Compound)

The composition layer of the step 1 contains a liquid crystal compound having a polymerizable group.

The type of the liquid crystal compound is not particularly limited. Generally, the liquid crystal compound can be classified into a rod-like type (rod-like liquid crystal compound) and a disk-like type (discotic liquid crystal compound) depending on the shape thereof. Further, the liquid crystal compound can be classified into a low molecular weight type and a high molecular weight type. The high molecular weight generally refers to having a polymerization degree of 100 or more (Polymer Physics-Phase Transition Dynamics, Masao Doi, p. 2, Iwanami Shoten, Publishers, 1992). Any liquid crystal compound can be used in the present invention, and it is preferable to use a rod-like liquid crystal compound or a discotic liquid crystal compound and it is more preferable to use a rod-like liquid crystal compound. Two or more rod-like liquid crystal compounds, two or more discotic liquid crystal compounds, or a mixture of a rod-like liquid crystal compound and a discotic liquid crystal compound may be used.

For example, rod-like liquid crystal compounds described in claim 1 of JP1999-513019A (JP-H11-513019A) and paragraphs [0026] to [0098] of JP2005-289980A can be preferably used as the rod-like liquid crystal compound.

For example, discotic liquid crystal compounds described in paragraphs [0020] to of JP2007-108732A and paragraphs [0013] to [0108] of JP2010-244038A can be preferably used as the discotic liquid crystal compound.

The type of the polymerizable group contained in the liquid crystal compound is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The optically anisotropic layer produced in the present invention is a layer formed by fixing a liquid crystal compound having a polymerizable group (a rod-like liquid crystal compound or discotic liquid crystal compound having a polymerizable group) by means of polymerization or the like. After being formed into a layer, the optically anisotropic layer no longer needs to exhibit liquid crystallinity.

The content of the liquid crystal compound in the composition layer is not particularly limited, and is preferably 60% by mass or more and more preferably 70% by mass or more with respect to the total mass of the composition layer, from the viewpoint that the alignment state of the liquid crystal compound can be easily controlled. The upper limit of the content of the liquid crystal compound is not particularly limited, and is preferably 99% by mass or less and more preferably 97% by mass or less.

(Other Components)

The composition layer may contain components other than the chiral agent and the liquid crystal compound.

For example, the composition layer may contain a polymerization initiator. In a case where the composition layer contains a polymerization initiator, the polymerization of the liquid crystal compound having a polymerizable group proceeds more efficiently.

The polymerization initiator may be, for example, a known polymerization initiator, examples of which include a photopolymerization initiator and a thermal polymerization initiator, among which a photopolymerization initiator is preferable. In particular, a polymerization initiator that is exposed to light for irradiation in the step 4 which will be described later is preferable.

In addition, the polymerization initiator is preferably such that the molar absorption coefficient that is the maximum among the wavelengths of light for irradiation in the step 3 is 0.1 times or less the molar absorption coefficient that is the maximum among the wavelengths of light for irradiation in the step 4.

The content of the polymerization initiator in the composition layer is not particularly limited, and is preferably 0.01% to 20% by mass and more preferably 0.5% to 10% by mass with respect to the total mass of the composition layer.

The composition layer may contain a polymerizable monomer different from the liquid crystal compound having a polymerizable group. Examples of the polymerizable monomer include a radically polymerizable compound and a cationically polymerizable compound, among which a polyfunctional radically polymerizable monomer is preferable. Examples of the polymerizable monomer include polymerizable monomers described in paragraphs [0018] to [0020] of JP2002-296423A.

The content of the polymerizable monomer in the composition layer is not particularly limited, and is preferably 1% to 50% by mass and more preferably 5% to 30% by mass with respect to the total mass of the liquid crystal compound.

The composition layer may contain a surfactant. Examples of the surfactant include conventionally known compounds, among which a fluorine-based compound is preferable. Specific examples of the surfactant include compounds described in paragraphs [0028] to [0056] of JP2001-330725A and compounds described in paragraphs [0069] to [0126] of JP2003-295212.

The composition layer may contain a polymer. Examples of the polymer include cellulose esters. Examples of the cellulose ester include cellulose esters described in paragraph [0178] of JP2000-155216A.

The content of the polymer in the composition layer is not particularly limited, and is preferably 0.1% to 10% by mass and more preferably 0.1% to 8% by mass with respect to the total mass of the liquid crystal compound.

The composition layer may contain an additive (alignment control agent) that promotes horizontal alignment or vertical alignment in order to bring a liquid crystal compound into a horizontal alignment state or a vertical alignment state, in addition to the foregoing components.

The composition layer may contain a leveling agent.

The leveling agent is not particularly limited, and is preferably a fluorine-based leveling agent or a silicon-based leveling agent and more preferably a fluorine-based leveling agent from the viewpoint that the distribution of the leveling agent which will be described later is easily formed.

The fluorine-based leveling agent is a leveling agent having a fluorine atom, which preferably has a fluoroaliphatic group.

The fluorine-based leveling agent preferably has a repeating unit represented by Formula (1).

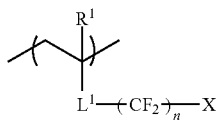

(1)

In Formula (1), $R^1$ represents a hydrogen atom, a halogen atom, or a methyl group.

$L^1$ represents a single bond or a divalent linking group. The divalent linking group is not particularly limited, and examples thereof include a divalent hydrocarbon group (for example, a divalent aliphatic hydrocarbon group such as an alkylene group having 1 to 10 carbon atoms, an alkenylene group having 1 to 10 carbon atoms, or an alkynylene group having 1 to 10 carbon atoms; or a divalent aromatic hydrocarbon group such as an arylene group), a divalent heterocyclic group, —O—, —S—, —NH—, —CO—, and a group formed by a combination thereof (for example, —CO—O—, —O-divalent hydrocarbon group-, —O—CO-divalent hydrocarbon group)$_m$-O— (where m represents an integer of 1 or more), or a —O—CO-divalent hydrocarbon group).

n represents an integer of 1 to 18, preferably an integer of 4 to 12, and more preferably an integer of 6 to 8.

X is a hydrogen atom or a fluorine atom.

The repeating unit represented by Formula (1) is preferably a repeating unit represented by Formula (2) from the viewpoint that the distribution of the leveling agent which will be described later is easily formed.

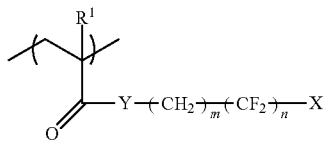

(2)

In Formula (2), the definitions of $R^1$, n and X are the same as the definitions of each group in Formula (1) above.

Y represents an oxygen atom, a sulfur atom, or —N($R^2$)—. $R^2$ represents a hydrogen atom or an alkyl group having 1 to 8 carbon atoms which may have a substituent.

m represents an integer of 1 to 6 and preferably an integer of 1 to 3.

The fluorine-based leveling agent may have only one type of repeating unit represented by Formula (1), or may have two or more types of repeating units represented by Formula (1).

The content of the repeating unit represented by Formula (1) in the fluorine-based leveling agent is not particularly limited, and is preferably 20% to 100% by mass and more preferably 30% to 95% by mass with respect to all the repeating units of the fluorine-based leveling agent, from the viewpoint that the distribution of the leveling agent which will be described later is easily formed.

In a case where the fluorine-based leveling agent has two or more types of repeating units represented by Formula (1), the total content thereof is preferably within the above range.

The fluorine-based leveling agent may have a repeating unit other than the repeating unit represented by Formula (1).

The other repeating unit may have, for example, a repeating unit having a hydrophilic group (for example, a poly(oxyalkylene) group or a hydroxy group).

The fluorine-based leveling agent may have a repeating unit represented by Formula (3).

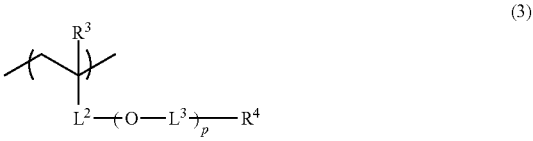

(3)

$R^3$ represents a hydrogen atom, a halogen atom, or a methyl group.

$L^2$ represents a single bond or a divalent linking group. The definition of the divalent linking group is as described above.

$L^3$ represents an alkylene group. The alkylene group preferably has 2 to 3 carbon atoms.

p represents an integer of 4 to 20 and preferably an integer of 5 to 15.

$R^4$ represents a hydrogen atom or a substituent. Examples of the substituent include an alkyl group, an alkoxy group, a halogen atom, an aryl group, a cyano group, a hydroxy group, an amino group, and a group formed by a combination thereof (for example, -alkylene group-OH).

The fluorine-based leveling agent may have only one type of repeating unit represented by Formula (3), or may have two or more types of repeating units represented by Formula (3).

The content of the repeating unit represented by Formula (3) in the fluorine-based leveling agent is not particularly limited, and is preferably 2% to 70% by mass and more preferably 5% to 60% by mass with respect to all the repeating units of the fluorine-based leveling agent, from the viewpoint that the distribution of the leveling agent which will be described later is easily formed.

In a case where the fluorine-based leveling agent has two or more types of repeating units represented by Formula (3), the total content thereof is preferably within the above range.

The weight-average molecular weight of the fluorine-based leveling agent is not particularly limited, and is preferably 3,000 to 30,000 and more preferably 5,000 to 25,000, from the viewpoint that the distribution of the leveling agent which will be described later is easily formed.

The silicon-based leveling agent is preferably a leveling agent containing a plurality of dialkylsilyloxy units as repeating units.

The content of the leveling agent in the composition layer is not particularly limited, and is preferably 0.010% to 5.000% by mass and more preferably 0.020% to 2.000% by mass with respect to the total mass of the composition layer, from the viewpoint that an optically anisotropic layer in which peeling is less likely to occur in the obtained optically anisotropic layer can be obtained.

(Substrate)

The substrate is a plate that supports the composition layer.

The substrate is preferably a transparent substrate. The transparent substrate is intended to refer to a substrate having a visible light transmittance of 60% or more, which preferably has a visible light transmittance of 80% or more and more preferably 90% or more.

The retardation value (Rth (550)) of the substrate in a thickness direction at a wavelength of 550 nm is not particularly limited, and is preferably −110 to 110 nm and more preferably −80 to 80 nm.

The in-plane retardation value (Re (550)) of the substrate at a wavelength of 550 nm is not particularly limited, and is preferably 0 to 50 nm, more preferably 0 to 30 nm, and still more preferably 0 to 10 nm.

A polymer having excellent optical performance transparency, mechanical strength, heat stability, moisture shielding property, isotropy, and the like is preferable as the material for forming the substrate.

Examples of the polymer film that can be used as the substrate include a cellulose acylate film (for example, a cellulose triacetate film (refractive index: 1.48), a cellulose diacetate film, a cellulose acetate butyrate film, or a cellulose acetate propionate film), a polyolefin film such as polyethylene or polypropylene, a polyester film such as polyethylene terephthalate or polyethylene naphthalate, a polyether sulfone film, a polyacrylic film such as polymethylmethacrylate, a polyurethane film, a polycarbonate film, a polysulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure, and more preferably triacetyl cellulose.

The substrate may contain various additives (for example, an optical anisotropy adjuster, a wavelength dispersion adjuster, a fine particle, a plasticizer, an ultraviolet inhibitor, a deterioration inhibitor, and a release agent).

The thickness of the substrate is not particularly limited, and is preferably 10 to 200 μm, more preferably 10 to 100 μm, and still more preferably 20 to 90 μm. In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

In addition, in order to impart slipperiness in a transport step and prevent a back surface and a front surface from sticking to each other after winding, a polymer layer in which inorganic particles having an average particle diameter of about 10 to 100 nm are mixed in a solid content mass ratio of 5% to 40% by mass may be arranged on one side of the substrate.

The substrate may be a so-called temporary support. That is, the substrate may be peeled off from the optically anisotropic layer after carrying out the production method according to the embodiment of the present invention.

In addition, the surface of the substrate may be directly subjected to a rubbing treatment. That is, a substrate that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the substrate in a certain direction with paper, gauze, felt, rubber, nylon fiber, polyester fiber, or the like can be used.

An alignment film may be arranged on the substrate.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett (LB) film method.

Further, there is also known an alignment film capable of expressing an alignment function by application of an electric field, application of a magnetic field, or light (preferably polarized light) irradiation.

The alignment film is preferably formed by a rubbing treatment of a polymer.

Examples of the polymer contained in the alignment film include a methacrylate-based copolymer, a styrene-based copolymer, a polyolefin, a polyvinyl alcohol, and a modified polyvinyl alcohol, a poly(N-methylolacrylamide), a polyester, a polyimide, a vinyl acetate copolymer, a carboxymethyl cellulose, and a polycarbonate described in paragraph [0022] of JP1996-338913A (JP-H08-338913A). In addition, a silane coupling agent can also be used as the polymer.

Above all, a water-soluble polymer (for example, a poly(N-methylolacrylamide), a carboxymethyl cellulose, a gelatin, a polyvinyl alcohol, or a modified polyvinyl alcohol) is preferable; a gelatin, a polyvinyl alcohol, or a modified polyvinyl alcohol is more preferable; and a polyvinyl alcohol or a modified polyvinyl alcohol is still more preferable.

As described above, the alignment film can be formed by applying a solution containing the above-mentioned polymer which is an alignment film forming material and an optional additive (for example, a crosslinking agent) onto a substrate, followed by heat-drying (crosslinking) and a rubbing treatment.

(Procedure of Step 1)

In the step 1, a composition layer containing the above-mentioned components is formed on a substrate, but the procedure is not particularly limited. For example, a method of applying a composition containing the above-mentioned chiral agent and liquid crystal compound having a polymerizable group onto a substrate, followed by a drying treatment if necessary (hereinafter, also simply referred to as "coating method"), and a method of separately forming a composition layer and transferring the formed layer onto a substrate can be mentioned. Among them, the coating method is preferable from the viewpoint of productivity.

Hereinafter, the coating method will be described in detail.

The composition used in the coating method contains the above-mentioned chiral agent, liquid crystal compound having a polymerizable group, and other components used as necessary (for example, a polymerization initiator, a polymerizable monomer, a surfactant, a polymer, and a leveling agent).

The content of each component in the composition is preferably adjusted to be the content of each component in the composition layer described above.

The coating method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

The film thickness of the coating film is not particularly limited and is preferably 0.1 to 20 µm, more preferably 0.2 to 15 µm, and still more preferably 0.5 to 10 µm.

<Step 2>

The step 2 is a step of subjecting the composition layer to a heat treatment to align the liquid crystal compound in the composition layer. Carrying out this step brings the liquid crystal compound in the composition layer into a predetermined alignment state (for example, a homogeneous alignment state).

With regard to heat treatment conditions, the optimum conditions are selected according to the liquid crystal compound used.

Above all, the heating temperature is often 10° C. to 250° C., more often 40° C. to 150° C., and still more often 50° C. to 130° C.

The heating time is often 0.1 to 60 minutes and more often 0.2 to 5 minutes.

The alignment state of the liquid crystal compound obtained in the step 2 changes according to the helical twisting power of the chiral agent described above.

For example, as will be described later, in order to form an optically anisotropic layer having, along a thickness direction, a first region in which the alignment state of the liquid crystal compound twist-aligned along a helical axis extending in a thickness direction is fixed, and a second region in which the alignment state of the homogeneously aligned liquid crystal compound is fixed, the absolute value of the weighted average helical twisting power of the chiral agent in the composition layer formed in the step 1 is preferably 0.0 to 1.9 µm$^{-1}$, more preferably 0.0 to 1.5 µm$^{-1}$, still more preferably 0.0 to 1.0 µm$^{-1}$, particularly preferably 0.0 to 0.5 µm$^{-1}$, more particularly preferably 0.0 to 0.02 µm$^{-1}$, and most preferably zero.

The weighted average helical twisting power of the chiral agent is a total value obtained by dividing the product of the helical twisting power of each chiral agent contained in the composition layer and the concentration (% by mass) of each chiral agent in the composition layer by the total concentration (% by mass) of the chiral agents in the composition layer, in a case where two or more chiral agents are contained in the composition. The weighted average helical twisting power is represented by Expression (Y), for example, in a case where two chiral agents (chiral agent X and chiral agent Y) are used in combination.

Weighted average helical twisting power (µm$^{-1}$)= (helical twisting power (µm$^{-1}$) of chiral agent $X$×concentration (% by mass) of chiral agent $X$ in composition layer+helical twisting power (µm$^{-1}$) of chiral agent $Y$×concentration (% by mass) of chiral agent $Y$ in composition layer)/ (concentration (% by mass) of chiral agent $X$ in composition layer+concentration (% by mass) of chiral agent $Y$ in composition layer)     Expression (Y)

However, in Expression (Y), in a case where the helical direction of the chiral agent is dextrorotatory, the helical twisting power has a positive value. In addition, in a case where the helical direction of the chiral agent is levorotatory, the helical twisting power has a negative value. That is, for example, in a case of a chiral agent having a helical twisting power of 10 µm$^{-1}$, the helical twisting power is expressed as 10 µm$^{-1}$ in a case where the helical direction of the helix induced by the chiral agent is dextrorotatory. On the other hand, in a case where the helical direction of the helix induced by the chiral agent is levorotatory, the helical twisting power is expressed as −10 µm$^{-1}$.

In a case where the absolute value of the weighted average helical twisting power of the chiral agent in the composition layer formed in the step 1 is 0, a composition layer 12 in which a liquid crystal compound LC is homogeneously aligned is formed on a substrate 10, as shown in FIG. 1. It should be noted that FIG. 1 is a schematic cross-sectional view of the substrate 10 and the composition layer 12. It is assumed that the chiral agent A and the chiral agent B are present in the composition layer 12 shown in FIG. 1 at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are assumed to be the same.

The homogeneous alignment in the present specification refers to a state in which a molecular axis of a liquid crystal compound (for example, a major axis in a case of a rod-like liquid crystal compound) is arranged horizontally and in the same direction with respect to the surface of the composition layer (optical uniaxiality).

Here, "horizontal" does not require that the molecular axis of the liquid crystal compound is strictly horizontal with respect to the surface of the composition layer, but is intended to mean an alignment in which the tilt angle of the average molecular axis of the liquid crystal compound in the composition layer with the surface of the composition layer is less than 20 degrees.

In addition, the same direction does not require that the molecular axis of the liquid crystal compound is arranged strictly in the same direction with respect to the surface of the composition layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The aspect in which the liquid crystal compound LC is homogeneously aligned has been described in FIG. 1, but the present invention is not limited to this aspect as long as the liquid crystal compound is in a predetermined alignment state. For example, as will be described in detail later, it may be an aspect in which the liquid crystal compound is twist-aligned along a helical axis extending along the thickness direction of the composition layer.

<Step 3>

The step 3 is a step of subjecting the composition layer to light irradiation under a condition of an oxygen concentration of 1% by volume or more, after the step 2. In the following, the mechanism of this step will be described with reference to the accompanying drawings. In the following, an example in which the step 3 is carried out on the composition layer 12 shown in FIG. 1 will be described as a representative example.

Figure 2:
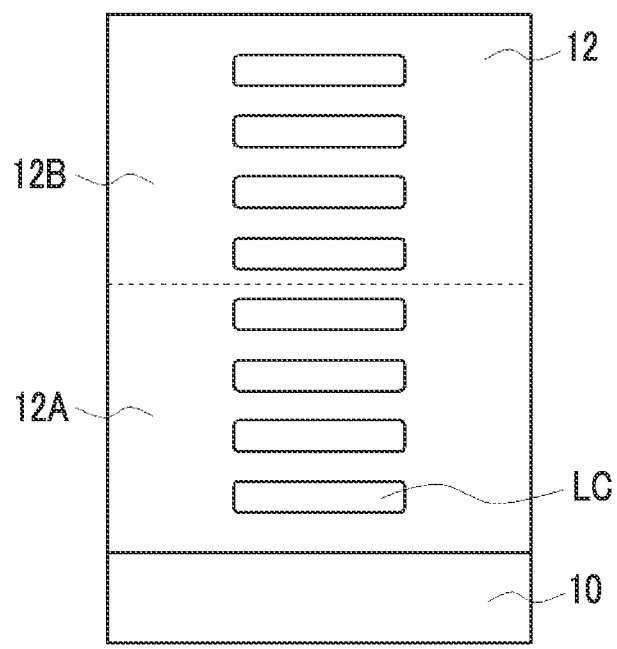
FIG. 2 is a cross-sectional view of a composition layer for explaining an example of a step 2 of the first embodiment of the present invention.
Figure 2:
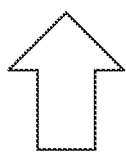

As shown in FIG. 2, in the above-mentioned step 2, light irradiation is carried out from the direction opposite to the composition layer 12 side of the substrate 10 (the direction of the white arrow in FIG. 2) under the condition that the oxygen concentration is 1% by volume or more. Although the light irradiation is carried out from the substrate 10 side in FIG. 2, the light irradiation may be carried out from the composition layer 12 side.

At that time, in a case where a lower region 12A of the composition layer 12 on the substrate 10 side and an upper region 12B on the side opposite to the substrate 10 side are compared, the surface of the upper region 12B is on the air side, so that the oxygen concentration in the upper region 12B is high and the oxygen concentration in the lower region 12A is low. Therefore, in a case where the composition layer 12 is irradiated with light, the polymerization of the liquid crystal compound easily proceeds in the lower region 12A, and the alignment state of the liquid crystal compound is fixed. The chiral agent A is also present in the lower region 12A, and the chiral agent A is also exposed to light and therefore the helical twisting power changes. However, since the alignment state of the liquid crystal compound is fixed in the lower region 12A, there is no change in the alignment state of the liquid crystal compound even in a case where the step 4 of subjecting the light-irradiated composition layer to a heat treatment, which will be described later, is carried out.

In addition, since the oxygen concentration is high in the upper region 12B, the polymerization of the liquid crystal compound is inhibited by oxygen and therefore the polymerization does not proceed easily even in a case where light irradiation is carried out. Since the chiral agent A is also present in the upper region 12B, the chiral agent A is exposed to light and therefore the helical twisting power changes. Therefore, in a case where the step 4 (heat treatment) which will be described later is carried out, the alignment state of the liquid crystal compound changes along with the changed helical twisting power.

That is, the immobilization of the alignment state of the liquid crystal compound is likely to proceed in the substrate-side region (lower region) of the composition layer by carrying out the step 3. In addition, the immobilization of the alignment state of the liquid crystal compound is difficult to proceed in the region of the composition layer (upper region) opposite to the substrate side, and the helical twisting power changes according to the exposed chiral agent A.

The step 3 is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit of the oxygen concentration is not particularly limited and may be, for example, 100% by volume.

The irradiation intensity of the light irradiation in the step 3 is not particularly limited and can be appropriately determined based on the helical twisting power of the chiral agent A. The irradiation amount of light irradiation in the step 3 is not particularly limited, and is preferably 300 mJ/cm² or less and more preferably 200 mJ/cm² or less from the viewpoint that a predetermined optically anisotropic layer is easily formed. The lower limit of the irradiation amount is preferably 10 mJ/cm² or more and more preferably 30 mJ/cm² or more from the viewpoint that a predetermined optically anisotropic layer is easily formed.

The light irradiation in the step 3 in the first embodiment is preferably carried out at 15° C. to 70° C. (preferably 15° C. to 50° C.).

The light used for the light irradiation may be any light that the chiral agent A is exposed to. That is, the light used for the light irradiation is not particularly limited as long as it is an actinic ray or radiation that changes the helical twisting power of the chiral agent A, and examples thereof include an emission line spectrum of a mercury lamp, a far ultraviolet ray represented by an excimer laser, an extreme ultraviolet ray, an X-ray, an ultraviolet ray, and an electron beam. Of these, an ultraviolet ray is preferable.

<Step 5>

The step 5 is a step of subjecting the composition layer to a heat treatment between the step 3 and the step 4 which will be described later. Carrying out this step leads to a change in the alignment state of the liquid crystal compound in the region where the helical twisting power of the chiral agent A in the composition layer subjected to light irradiation changes. More specifically, this step is a step of subjecting the composition layer after the step 3 to a heat treatment to align the liquid crystal compound in the composition layer not fixed in the step 3.

In the following, the mechanism of this step will be described with reference to the accompanying drawings. In the following, a case where the step 5 is carried out after the step 3 is carried out on the composition layer 12 shown in FIG. 1 will be described as a representative example.

As described above, in a case where the step 3 is carried out on the composition layer 12 shown in FIG. 1, the alignment state of the liquid crystal compound is fixed in the lower region 12A, whereas the polymerization of the liquid crystal compound is difficult to proceed and the alignment state of the liquid crystal compound is not fixed in the upper region 12B. In addition, the helical twisting power of the chiral agent A changes in the upper region 12B. In a case where such a change in the helical twisting power of the chiral agent A occurs, the force of twisting the liquid crystal compound changes in the upper region 12B, as compared with the state before light irradiation. This point will be described in more detail.

As described above, the chiral agent A and the chiral agent B are present in the composition layer 12 shown in FIG. 1 at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are the same. Therefore, the weighted average helical twisting power of the chiral agent in the composition layer before light irradiation is 0.

Figure 4:
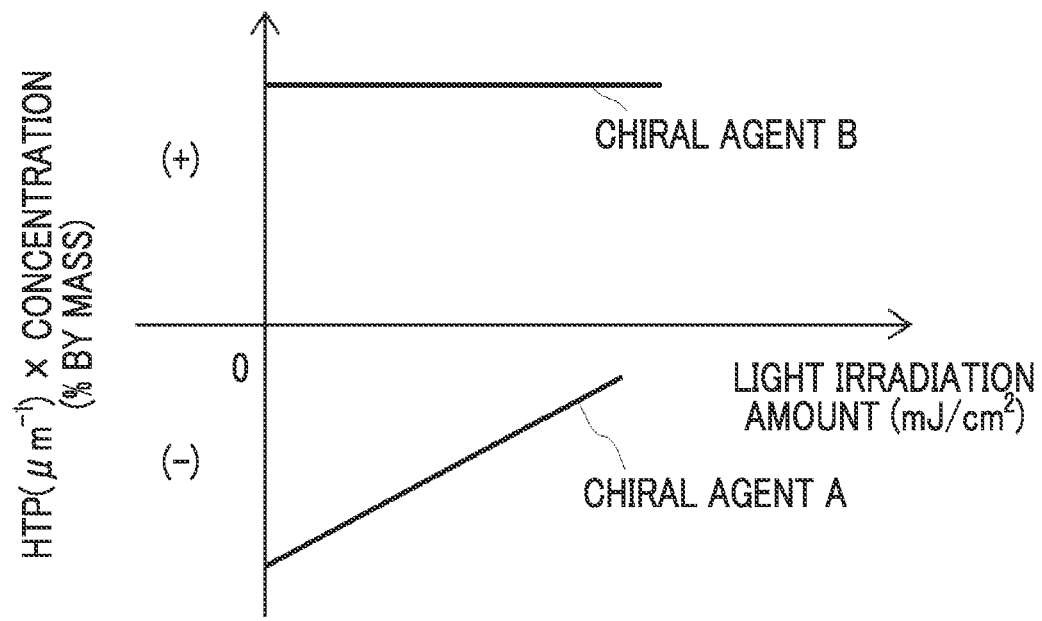
FIG. 4 is a schematic diagram of a graph plotting a relationship between a helical twisting power (HTP) ($\mu m^{-1}$)×a concentration (% by mass) and a light irradiation amount (mJ/cm$^2$) for each of chiral agent A and chiral agent B.

The above aspect is shown in FIG. 4. In FIG. 4, the vertical axis represents the "helical twisting power ($\mu m^{-1}$) of chiral agent×concentration (% by mass) of chiral agent", the helical twisting power increases as the value thereof deviates from zero. First, the relationship between the chiral agent A and the chiral agent B in the composition layer before light irradiation corresponds to the time in a case where the light irradiation amount is zero, and therefore corresponds to a state in which the absolute value of "helical twisting power ($\mu m^{-1}$) of chiral agent A×concentration (% by mass) of chiral agent A" and the absolute value of "helical twisting power ($\mu m^{-1}$) of chiral agent B×concentration (% by mass) of chiral agent B" are equal. That is, the helical twisting powers of both the chiral agent A that induces levorotatory turning and the chiral agent B that induces dextrorotatory turning are offset.

Figure 5:
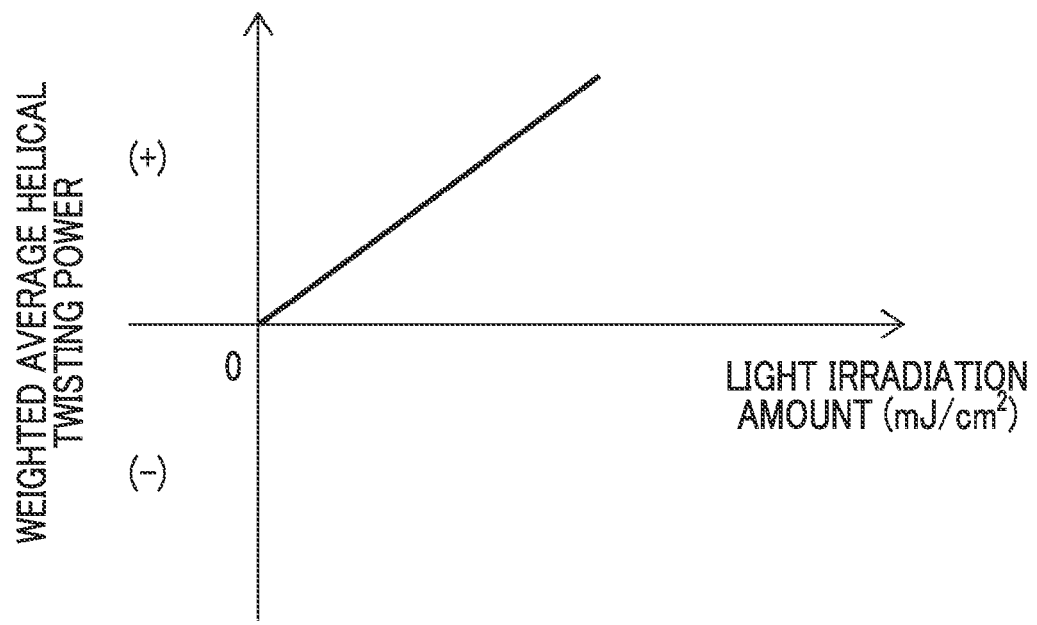
FIG. 5 is a schematic diagram of a graph plotting a relationship between a weighted average helical twisting power ($\mu m^{-1}$) and a light irradiation amount (mJ/cm$^2$) in a system in which chiral agent A and chiral agent B are used in combination.

In a case where light irradiation is carried out in the upper region 12B in such a state and the helical twisting power of the chiral agent A decreases with the light irradiation amount as shown in FIG. 4, the weighted average helical twisting power of the chiral agent in the upper region 12B becomes large and therefore the dextrorotatory helical twisting power becomes strong, as shown in FIG. 5. That is, as for the helical twisting power that induces the helix of the liquid crystal compound, an increase in the irradiation amount leads to an increase in the helical twisting power in the direction (+) of the helix induced by the chiral agent B.

Figure 3:
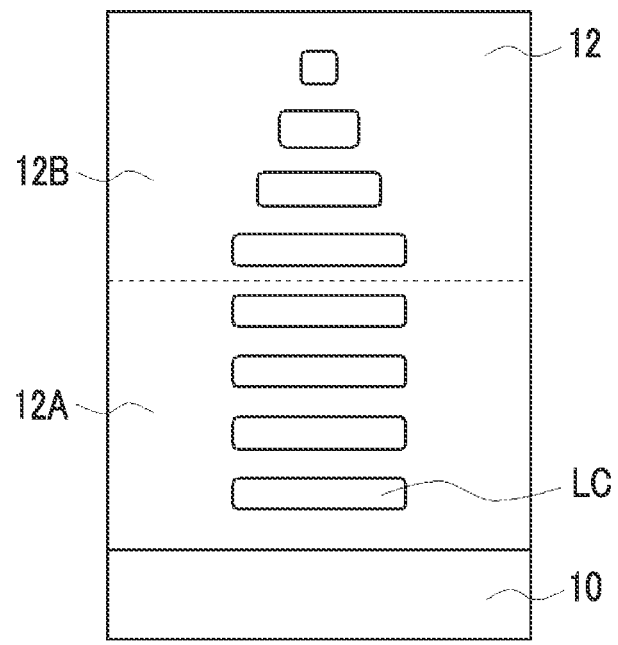
FIG. 3 is a cross-sectional view of a composition layer for explaining an example in a case where a step 5 of the first embodiment of the present invention is carried out.
Figure 3:

Therefore, in a case where the composition layer 12 after the step 3 in which such a change in the weighted average helical twisting power occurred is subjected to a heat treatment to promote the realignment of the liquid crystal compound, the liquid crystal compound LC is twist-aligned along a helical axis extending along the thickness direction of the composition layer 12 in the upper region 12B, as shown in FIG. 3.

On the other hand, as described above, the polymerization of the liquid crystal compound proceeds to fix the alignment state of the liquid crystal compound during the step 3 in the lower region 12A of the composition layer 12, so that the realignment of the liquid crystal compound does not proceed.

As described above, carrying out the step 5 leads to the formation of a plurality of regions having different alignment states of the liquid crystal compound along the thickness direction of the composition layer.

The aspect in which a chiral agent whose helical twisting power decreases upon irradiation with light is used as the chiral agent A has been described in FIGS. 4 and 5, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound is twist-aligned in the turning direction induced by the chiral agent A.

In addition, the aspect in which the chiral agent A and the chiral agent B are used in combination has been described in FIGS. 4 and 5, but the present invention is not limited to this aspect. For example, it may be an aspect in which two types of chiral agents A are used. Specifically, it may be an aspect in which a chiral agent A1 that induces levorotatory turning and a chiral agent A2 that induces dextrorotatory turning are used in combination. The chiral agents A1 and A2 may be each independently a chiral agent whose helical twisting power increases or a chiral agent whose helical twisting power decreases. For example, a chiral agent that induces levorotatory turning and whose helical twisting power increases upon irradiation with light and a chiral agent that induces dextrorotatory turning and whose helical twisting power decreases upon irradiation with light may be used in combination.

With regard to heat treatment conditions, the optimum conditions are selected according to the liquid crystal compound used.

Above all, the heating temperature is preferably a temperature for heating from the state of the step 3, often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

The difference between the temperature of the heat treatment in the step 5 and the temperature at the time of light irradiation in the step 3 is preferably 5° C. or more, more preferably 10° C. to 110° C., and still more preferably 20° C. to 110° C.

In addition, the absolute value of the weighted average helical twisting power of the chiral agent in the composition layer after light irradiation is not particularly limited, and the absolute value of the difference between the weighted average helical twisting power of the chiral agent in the composition layer after light irradiation and the weighted average helical twisting power of the chiral agent in the composition layer before light irradiation is preferably 0.05 $\mu m^{-1}$ or more, more preferably 0.05 to 10.0 $\mu m^{-1}$, and still more preferably 0.1 to 10.0 $\mu m^{-1}$.

<Step 4>

The step 4 is a step of subjecting the light-irradiated composition layer to a curing treatment to fix an alignment state of the liquid crystal compound to form an optically anisotropic layer having a plurality of regions having different alignment states of the liquid crystal compound along a thickness direction, after the step 5. By carrying out this step, the alignment state of the liquid crystal compound in the composition layer is fixed, and as a result, a predetermined optically anisotropic layer is formed. For example, in a case where the composition layer 12 shown in FIG. 3 is subjected to a curing treatment, an optically anisotropic layer is formed which has, along a thickness direction, a first region in which the alignment state of the liquid crystal compound twist-aligned along a helical axis extending along a thickness direction is fixed and a second region in which the alignment state of the homogeneously aligned liquid crystal compound is fixed.

The method of the curing treatment is not particularly limited, and examples thereof include a photocuring treatment and a thermal curing treatment. Above all, a light irradiation treatment is preferable, and an ultraviolet irradiation treatment is more preferable.

For ultraviolet irradiation, a light source such as an ultraviolet lamp is used.

The irradiation amount of light (for example, ultraviolet rays) is not particularly limited, and is generally preferably about 100 to 800 $mJ/cm^2$.

The atmosphere at the time of light irradiation is not particularly limited. The light irradiation may be carried out under air or the light irradiation may be carried out under an inert atmosphere. In particular, the light irradiation is preferably carried out at an oxygen concentration of less than 1% by volume.

In a case where a photocuring treatment is carried out as the curing treatment, the temperature conditions at the time of photocuring are not particularly limited and the temperature may be any temperature at which the alignment state of the liquid crystal compound in the step 5 is maintained. The difference between the temperature of the heat treatment in the step 5 and the temperature at the time of the photocuring treatment is preferably 100° C. or less and more preferably 80° C. or less.

It is preferable that the temperature of the heat treatment in the step 5 and the temperature at the time of the photocuring treatment are the same, or the temperature at the time of the photocuring treatment is lower than the temperature of the heat treatment.

The alignment state of the liquid crystal compound is fixed in the optically anisotropic layer obtained by carrying out the curing treatment.

The "fixed" state is the most typical and preferable aspect of a state in which the alignment of the liquid crystal compound is maintained. The "fixed" state is not limited thereto and is specifically more preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

In the optically anisotropic layer, it is no longer necessary for the composition in the layer to finally exhibit liquid crystallinity.

In the aspect shown in FIG. 3, an optically anisotropic layer is prepared which has, along a thickness direction, a first region in which the alignment state of the liquid crystal compound right-handed twist-aligned along a helical axis extending along a thickness direction is fixed and a second region in which the alignment state of the homogeneously aligned liquid crystal compound is fixed, but the present invention is not limited to the above aspect.

For example, the twisted alignment of the liquid crystal compound may be a left-handed twist. That is, the direction of the twisted alignment of the liquid crystal compound may be a left-handed twist (counterclockwise twist) or a right-handed twist (clockwise twist).

A known method can be mentioned as a method for specifying the alignment state of the liquid crystal compound. For example, there is a method of observing the cross section of the optically anisotropic layer with a polarization microscope to specify the alignment state of the liquid crystal compound.

In addition, in the aspect shown in FIG. 3, the optically anisotropic layer has two regions in which the alignment states of the liquid crystal compound are different, but the present invention is not limited to the above aspect, and the optically anisotropic layer may have three or more regions in which the alignment states of the liquid crystal compound are different.

In a case where the optically anisotropic layer has two regions in which the alignment states of the liquid crystal compound are different, the ratio of the thickness of the thick region of the two regions to the thickness of the thin region of the two regions is not particularly limited and is preferably more than 1 and 9 or less and more preferably more than 1 and 4 or less.

In a case where the thicknesses of the two regions are the same, the above ratio is 1.

In addition, the optically anisotropic layer may be an optically anisotropic layer which has, along a thickness direction, a first region in which the alignment state of the liquid crystal compound twist-aligned along a helical axis extending along a thickness direction is fixed and a second region in which the alignment state of the twist-aligned liquid crystal compound is fixed at a twist angle different from that of the first region along a helical axis extending along a thickness direction.

Figure 6:
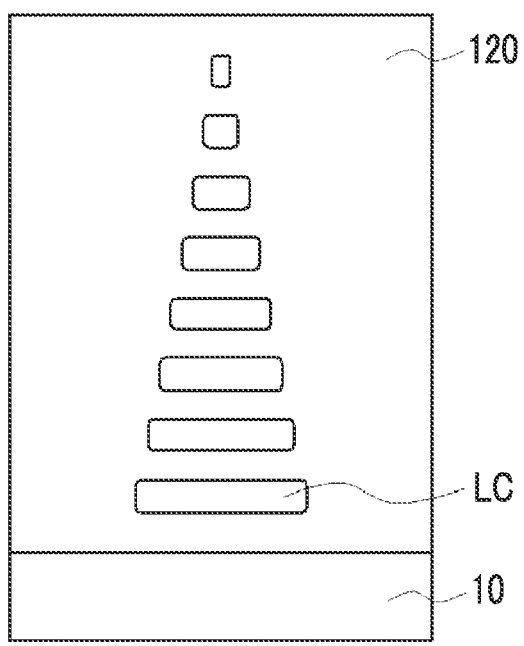
FIG. 6 is a cross-sectional view of a composition layer for explaining another example of the step 1 of the first embodiment of the present invention.
Figure 7:
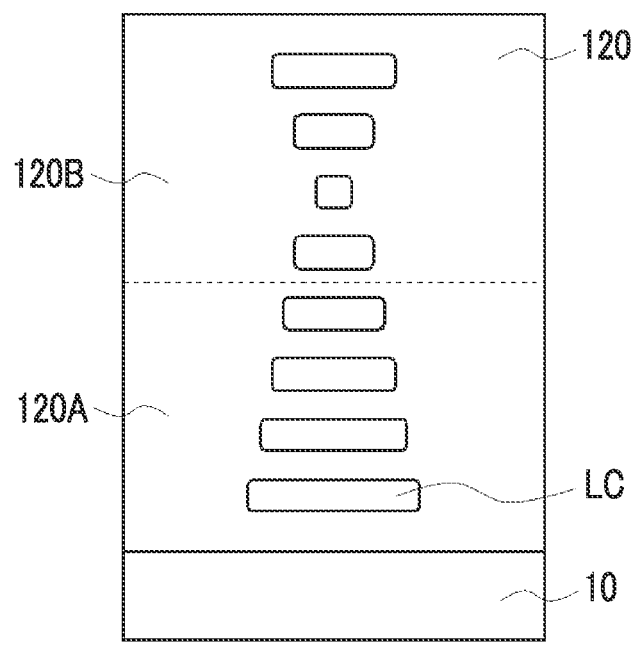
FIG. 7 is a cross-sectional view of a composition layer for explaining another example in a case where a step 5 of the first embodiment of the present invention is carried out.

As a method for forming regions having different twisted angles of liquid crystal compound as described above, for example, a method of increasing (for example, more than 0 $\mu m^{-1}$) the absolute value of the weighted average helical twisting power of the chiral agent in the composition layer formed in the step 1 described above can be mentioned. In a case where the absolute value of the weighted average helical twisting power of the chiral agent in the composition layer formed in the step 1 is large, first, the liquid crystal compound is twist-aligned along a helical axis extending along a thickness direction in a composition layer 120 in which the step 2 is carried out, as shown in FIG. 6. In a case where the above-mentioned steps (particularly, the step 3) are carried out on such a composition layer, the twisted alignment of the liquid crystal compound is fixed as it is in the region having a low oxygen concentration (a lower region 120A in FIG. 7) in the composition layer; whereas the helical twisting power changes in the region having a high oxygen concentration (an upper region 120B in FIG. 7) in the composition layer, and as a result, a region having a different twisted angle of liquid crystal compound can be formed after the step 5 is carried out.

The optical properties in the formed optically anisotropic layer are not particularly limited, and an optimum value is selected according to the application. Hereinafter, as an example, the case of an optically anisotropic layer which is prepared by the above-mentioned procedure and which has, along a thickness direction, a first region in which the alignment state of the liquid crystal compound twist-aligned along a helical axis extending along a thickness direction is fixed and a second region in which the alignment state of the homogeneously aligned liquid crystal compound is fixed (hereinafter, this aspect is also referred to as "optical anisotropic layer A") will be described in detail.

In a case where the thickness of the first region of the optically anisotropic layer A is defined as d1 and the refractive index anisotropy of the first region measured at a wavelength of 550 nm is defined as $\Delta n1$, the first region preferably satisfies Expression (1-1) from the viewpoint that an optically anisotropic layer can be suitably applied to a circularly polarizing plate.

$$100 \text{ nm} \leq \Delta n1 d1 \leq 240 \text{ nm} \qquad \text{Expression (1-1)}$$

Above all, the first region more preferably satisfies Expression (1-2) and still more preferably satisfies Expression (1-3).

$$120 \text{ nm} \leq \Delta n1 d1 \leq 220 \text{ nm} \qquad \text{Expression (1-2)}$$

$$140 \text{ nm} \leq \Delta n1 d1 \leq 200 \text{ nm} \qquad \text{Expression (1-3)}$$

The refractive index anisotropy $\Delta n1$ means the refractive index anisotropy of the first region.

The absolute value of the twisted angle of liquid crystal compound in the first region is not particularly limited and is preferably 60 to 120° and more preferably 70 to 1100 from the viewpoint that an optically anisotropic layer can be suitably applied to a circularly polarizing plate.

First, the twisted alignment of the liquid crystal compound is intended to mean that the liquid crystal compound from one surface (the surface on the substrate 10 side in FIG. 3) to the other surface (the surface on the side opposite to the substrate 10 side in FIG. 3) of the first region is twisted about the thickness direction of the first region. Therefore, the twisted angle means an angle formed by the molecular axis of the liquid crystal compound on one surface of the first region (major axis in a case of a rod-like liquid crystal compound) and the molecular axis of the liquid crystal compound on the other surface of the first region.

The twisted angle is measured using Axoscan of Axometrics, Inc. and using device analysis software of Axometrics, Inc.

In addition, in a case where the thickness of the second region of the optically anisotropic layer A is defined as d2 and the refractive index anisotropy of the second region measured at a wavelength of 550 nm is defined as $\Delta n2$, the second region preferably satisfies Expression (2-1) from the viewpoint that an optically anisotropic layer can be suitably applied to a circularly polarizing plate.

$$100 \text{ nm} \leq \Delta n2 d2 \leq 240 \text{ nm} \qquad \text{Expression (2-1)}$$

Above all, the second region more preferably satisfies Expression (2-2) and still more preferably satisfies Expression (2-3).

$$120 \text{ nm} \leq \Delta n2d2 \leq 220 \text{ nm} \qquad \text{Expression (2-2)}$$

$$140 \text{ nm} \leq \Delta n2d2 \leq 200 \text{ nm} \qquad \text{Expression (2-3)}$$

The refractive index anisotropy Δn2 means the refractive index anisotropy of the second region.

The second region is a region in which the alignment state of the homogeneously aligned liquid crystal compound is fixed. The definition of homogeneous alignment is as described above.

The difference between Δn1d1 and Δn2d2 is not particularly limited and is preferably −50 to 50 nm and more preferably −30 to 30 nm from the viewpoint that an optically anisotropic layer can be suitably applied to a circularly polarizing plate.

In addition, as in the above aspect, in a case where the optically anisotropic layer formed by the production method according to the embodiment of the present invention has two regions in which the alignment states of the liquid crystal compound are different along a thickness direction (hereinafter, the two regions are referred to as region X and region Y), the slow axis on the surface of the region X on the region Y side and the slow axis on the surface of the region Y on the region X side are often parallel.

The optical properties in the optically anisotropic layer are not limited to the above-mentioned aspects. For example, in a case where the optically anisotropic layer has two regions in which the alignment states of the liquid crystal compound are different along a thickness direction, it is preferable that the two regions each satisfy the optical properties (relationship between twisted angle, Δnd, ReB, and slow axis of liquid crystal compound) of the first optically anisotropic layer and the second optically anisotropic layer according to claim 1 or 6 of JP5960743B.

In addition, in another aspect, in a case where the optically anisotropic layer has two regions in a thickness direction, it is preferable that the two regions satisfy the optical properties (relationship between twisted angle, Δn1d1, Δn2d2, and slow axis of liquid crystal compound) of the first optically anisotropic layer and the second optically anisotropic layer described in JP5753922B.

The optically anisotropic layer preferably exhibits reverse wavelength dispersibility.

That is, it is preferable that Re (450), which is the in-plane retardation of the optically anisotropic layer measured at a wavelength of 450 nm, Re (550), which is the in-plane retardation of the optically anisotropic layer measured at a wavelength of 550 nm, and Re (650), which is the in-plane retardation of the optically anisotropic layer measured at a wavelength of 650 nm, have a relationship of Re (450)≤Re (550)≤Re (650).

The optical properties of the optically anisotropic layer are not particularly limited, and it is preferable that the optically anisotropic layer functions as a λ/4 plate.

The λ/4 plate is a plate having a function of converting linearly polarized light having a certain specific wavelength into circularly polarized light (or converting circularly polarized light into linearly polarized light), and refers to a plate (optically anisotropic layer) in which an in-plane retardation Re (λ) at a specific wavelength λ nm satisfies Re (λ)=λ/4.

This expression may be achieved at any wavelength in a visible light range (for example, 550 nm), and the in-plane retardation Re (550) at a wavelength of 550 nm preferably satisfies a relationship of 110 nm≤Re (550)≤180 nm.

The thickness of the optically anisotropic layer is not particularly limited and is preferably 0.05 to 10 μm, more preferably 0.1 to 8.0 μm, and still more preferably 0.2 to 6.0 μm.

Second Embodiment

The second embodiment of the method for producing an optically anisotropic layer according to the embodiment of the present invention includes the following step 1, step 2, step 3, and step 4. However, in the second embodiment, the step 3 is carried out under heating conditions.

Step 1: a step of forming a composition layer containing a chiral agent containing at least a photosensitive chiral agent whose helical twisting power changes upon irradiation with light and a liquid crystal compound having a polymerizable group on a substrate Step 2: a step of subjecting the composition layer to a heat treatment to align the liquid crystal compound in the composition layer Step 3: a step of subjecting the composition layer to light irradiation in the presence of oxygen, after the step 2

Step 4: a step of subjecting the light-irradiated composition layer to a curing treatment to fix an alignment state of the liquid crystal compound to form an optically anisotropic layer having a plurality of regions having different alignment states of the liquid crystal compound along a thickness direction The second embodiment and the first embodiment carry out the same treatment, except that the step 3 is carried out under heating conditions without carrying out the step 5 in the second embodiment.

Hereinafter, only the step 3 (particularly, heat treatment) of the second embodiment will be described.

In the second embodiment, the step 3 is carried out under heating conditions.

With regard to heat treatment conditions, the optimum conditions are selected according to the liquid crystal compound used.

Above all, the heating temperature is often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

In the second embodiment, the composition layer as shown in FIG. 3 can be formed without carrying out a separate heating step, by carrying out the heat treatment in the step 3.

<<Applications>>

The optically anisotropic layer can be combined with a variety of members.

Figure 8:
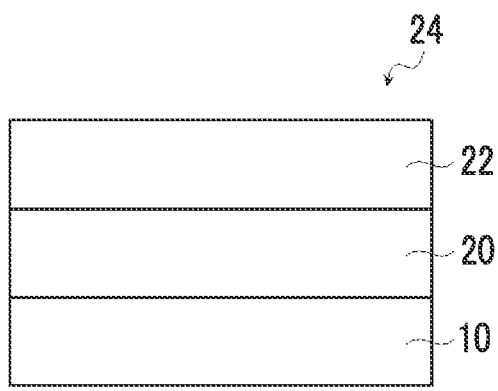
FIG. 8 is a cross-sectional view showing an embodiment of a laminate of the present invention.

For example, the optically anisotropic layer may be combined with another optically anisotropic layer. That is, a laminate 24 including a substrate 10, an optically anisotropic layer 20 produced by the above-mentioned production method, and another optically anisotropic layer 22 may be prepared as shown in FIG. 8. Although the laminate 24 shown in FIG. 8 includes the substrate 10, the laminate may not include the substrate.

The other optically anisotropic layer is not particularly limited, and examples thereof include A-plates (a positive A-plate and a negative A-plate) and C-plates (a positive C-plate and a negative C-plate). Among them, the C-plate is preferable from the viewpoint that it can be easily applied to various applications (for example, a circularly polarizing plate) which will be described later.

The range of the absolute value of the retardation of the C-plate in a thickness direction at a wavelength of 550 nm is not particularly limited and is preferably 5 to 300 nm and more preferably 10 to 200 nm.

In the present specification, the A-plate and the C-plate are defined as follows.

There are two types of A-plates, a positive A-plate (A-plate which is positive) and a negative A-plate (A-plate which is negative). The positive A-plate satisfies the relationship of Expression (A1) and the negative A-plate satisfies the relationship of Expression (A2) in a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz. In addition, the positive A-plate has an Rth showing a positive value and the negative A-plate has an Rth showing a negative value.

$$nx > ny \approx nz \quad \text{Expression (A1)}$$

$$ny < nx \approx nz \quad \text{Expression (A2)}$$

It should be noted that the symbol "≈" encompasses not only a case where the both sides are completely the same as each other but also a case where the both sides are substantially the same as each other. The expression "substantially the same" means that, for example, a case where (ny−nz)×d (in which d is a thickness of a film) is −10 to 10 nm and preferably −5 to 5 nm is also included in "ny≈nz"; and a case where (nx−nz)×d is −10 to 10 nm and preferably −5 to 5 nm is also included in "nx≈nz".

There are two types of C-plates, a positive C-plate (C-plate which is positive) and a negative C-plate (C-plate which is negative). The positive C-plate satisfies the relationship of Expression (C1) and the negative C-plate satisfies the relationship of Expression (C2). In addition, the positive C-plate has an Rth showing a negative value and the negative C-plate has an Rth showing a positive value.

$$nz > nx \approx ny \quad \text{Expression (C1)}$$

$$nz < nx \approx ny \quad \text{Expression (C2)}$$

It should be noted that the symbol "≈" encompasses not only a case where the both sides are completely the same as each other but also a case where the both sides are substantially the same as each other. The expression "substantially the same" means that, for example, a case where (nx−ny)×d (in which d is a thickness of a film) is 0 to 10 nm and preferably 0 to 5 nm is also included in "nx≈ny".

The method for producing the above-mentioned laminate is not particularly limited, and a known method can be mentioned. For example, there is a method of laminating an optically anisotropic layer obtained by the production method according to the embodiment of the present invention and another optically anisotropic layer (for example, a C-plate) to obtain a laminate. As the method of laminating, another separately prepared optically anisotropic layer may be bonded onto the optically anisotropic layer obtained by the production method according to the embodiment of the present invention, or a composition for forming another optically anisotropic layer may be applied onto the optically anisotropic layer obtained by the production method according to the embodiment of the present invention to form another optically anisotropic layer.

Figure 9:
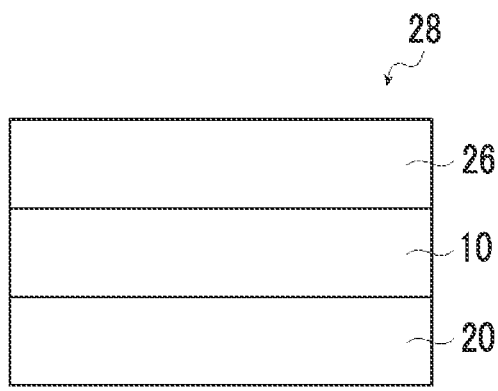
FIG. 9 is a cross-sectional view showing an embodiment of an optically anisotropic layer with a polarizer of the present invention.

In addition, the optically anisotropic layer obtained by the production method according to the embodiment of the present invention may be combined with a polarizer. That is, an optically anisotropic layer 28 with a polarizer, which includes a substrate 10, an optically anisotropic layer 20 produced by the above-mentioned production method, and a polarizer 26, may be prepared as shown in FIG. 9. In FIG. 9, the polarizer 26 is arranged on the substrate 10, but the present invention is not limited to this aspect and the polarizer 26 may be arranged on the optically anisotropic layer 20.

In addition, although the optically anisotropic layer 28 with a polarizer shown in FIG. 9 includes the substrate 10, the substrate may not be included in the optically anisotropic layer with a polarizer.

The positional relationship in a case where the optically anisotropic layer and the polarizer are laminated is not particularly limited. In a case where the optically anisotropic layer has, along a thickness direction, a first region in which the alignment state of the liquid crystal compound twist-aligned along a helical axis extending along a thickness direction is fixed and a second region in which the alignment state of the homogeneously aligned liquid crystal compound is fixed, the absolute value of the angle formed by the in-plane slow axis of the second region and the absorption axis of the polarizer is preferably 5 to 25° and more preferably 10 to 20° from the viewpoint that an optically anisotropic layer can be suitably applied to a circularly polarizing plate or the like.

In addition, it is preferable that, in a case where the angle formed by the in-plane slow axis of the second region and the absorption axis of the polarizer is negative, the twisted angle of liquid crystal compound in the first region is also negative; and it is preferable that, in a case where the angle formed by the in-plane slow axis of the second region and the absorption axis of the polarizer is positive, the twisted angle of liquid crystal compound in the first region is also preferably positive.

The case where the angle formed by the in-plane slow axis and the polarizer is negative means that the rotation angle of the in-plane slow axis is clockwise with reference to the absorption axis of the polarizer in a case of being visually recognized from the polarizer side; and the case where the angle formed by the in-plane slow axis and the polarizer is positive means that the rotation angle of the in-plane slow axis is counterclockwise with reference to the absorption axis of the polarizer in a case of being visually recognized from the polarizer side.

In addition, regarding the twisted angle of liquid crystal compound, in a case where the alignment axis direction of the liquid crystal compound on the back side is clockwise (right-hand turning) with reference to the alignment axis direction of the liquid crystal compound on the surface side (front side), it is expressed as negative; and in a case where such an alignment axis direction of the liquid crystal compound is counterclockwise (left-hand turning), it is expressed as positive.

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be arranged on one side or both sides of the polarizer.

The method for producing the optically anisotropic layer with a polarizer is not particularly limited, and a known method can be mentioned. For example, there is a method of laminating an optically anisotropic layer obtained by the production method according to the embodiment of the present invention and a polarizer to obtain an optically anisotropic layer with a polarizer.

Although the aspect in which an optically anisotropic layer and a polarizer are laminated has been described above, the above-mentioned laminate and a polarizer may be laminated to produce a laminate with a polarizer in the present invention.

The optically anisotropic layer can be applied to various applications. For example, the optically anisotropic layer can be suitably applied to a circularly polarizing plate, and the above-mentioned optically anisotropic layer with a polarizer can also be used as a circularly polarizing plate.

The circularly polarizing plate having the above configuration can be suitably used for antireflection applications of an image display apparatus such as a liquid crystal display device (LCD), a plasma display panel (PDP), an electroluminescent display (ELD), or a cathode tube display device (CRT) to improve a contrast ratio of display light.

For example, an aspect in which the circularly polarizing plate of the present invention is used on a light extraction surface side of an organic EL display device can be mentioned. In this case, the external light is linearly polarized by a polarizing film and then passes through the optically anisotropic layer to become circularly polarized light. In a case where this circularly polarized light is reflected by a metal electrode, the circularly polarized state is reversed, and in a case where the circularly polarized light in the reversed state passes through the optically anisotropic layer again, the passed light becomes linearly polarized light tilted by 90° from the time of incidence, reaches the polarizing film, and is absorbed. As a result, the influence of external light can be suppressed.

Above all, the above-mentioned optically anisotropic layer with a polarizer or the above-mentioned laminate with a polarizer is preferably applied to an organic EL display device. That is, it is preferable that the optically anisotropic layer with a polarizer or the laminate with a polarizer is arranged on an organic EL panel of the organic EL display device and applied for antireflection applications.

The organic EL panel is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

<<Optically Anisotropic Layer>>

Hereinafter, one embodiment of the optically anisotropic layer according to the embodiment of the present invention will be described in detail.

One of suitable aspects of the optically anisotropic layer according to the embodiment of the present invention may be, for example, an optically anisotropic layer having a configuration which will be described later (hereinafter, also referred to as "specific optically anisotropic layer"). The specific optically anisotropic layer has a plurality of regions in which the alignment states of the liquid crystal compound are different in a thickness direction, in which peeling is unlikely to occur in the layer.

In the related art, optically anisotropic layers to be laminated were formed by coating each layer in a case of producing a laminated type optically anisotropic layer. On the other hand, in the related art, a leveling agent is contained in a composition for forming the optically anisotropic layer, and in a case where such a composition is applied twice or more to form an optically anisotropic layer having a plurality of regions in which the alignment states of the liquid crystal compound are different in a thickness direction, it has been found that there is a region in which the leveling agent is unevenly distributed inside the optically anisotropic layer. Then, it has been found that peeling is likely to occur in the unevenly distributed region.

On the other hand, in the specific optically anisotropic layer, peeling in the layer can be prevented from occurring by controlling the distribution of the leveling agent inside the layer.

The specific optically anisotropic layer is an optically anisotropic layer formed of a liquid crystal compound, and contains a leveling agent.

In addition, in the specific optically anisotropic layer, in a case where components of the specific optically anisotropic layer in a depth direction are analyzed by time-of-flight secondary ion mass spectrometry while irradiating the specific optically anisotropic layer with an ion beam from one surface to the other surface of the specific optically anisotropic layer, a profile of a secondary ion intensity derived from the leveling agent in a depth direction is obtained, a higher secondary ion intensity derived from the leveling agent, out of a secondary ion intensity derived from the leveling agent on one surface of the specific optically anisotropic layer and a secondary ion intensity derived from the leveling agent on the other surface of the specific optically anisotropic layer, is defined as a first intensity, the secondary ion intensity which is $1/1000$ of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of $1/500$ or more of the first intensity is observed at any depth of a region between the first position and the second position.

Further, the specific optically anisotropic layer satisfies the following requirement 1 or 2.

Requirement 1: The specific optically anisotropic layer has, along a thickness direction, a region in which an alignment state of the liquid crystal compound twist-aligned along a helical axis extending along a thickness direction is fixed, and a region in which an alignment state of a homogeneously aligned liquid crystal compound is fixed.

Requirement 2: The specific optically anisotropic layer has, along a thickness direction, a plurality of regions in which the alignment state of the liquid crystal compound twist-aligned along a helical axis extending along a thickness direction is fixed, and twisted angles of liquid crystal compounds in the plurality of regions are different from each other.

Hereinafter, aspects of the specific optically anisotropic layer will be described in detail.

The specific optically anisotropic layer is a layer formed of a liquid crystal compound.

More specifically, the specific optically anisotropic layer is an optically anisotropic layer satisfying requirements 1 and 2 which will be described later, the details of which will be described later.

The specific optically anisotropic layer contains a leveling agent.

The definition of the leveling agent is as described above.

The content of the leveling agent in the specific optically anisotropic layer is not particularly limited, and is preferably 0.010% to 5.000% by mass and more preferably 0.020% to 2.000% by mass with respect to the total mass of the specific optically anisotropic layer, from the viewpoint that an optically anisotropic layer in which peeling is less likely to occur in the optically anisotropic layer can be obtained.

The specific optically anisotropic layer may contain materials other than the above-mentioned materials.

Examples of other materials include other components that may be included in the above-mentioned composition for forming an optically anisotropic layer.

In a case where components of the specific optically anisotropic layer in a depth direction are analyzed by time-of-flight secondary ion mass spectrometry while irradiating the specific optically anisotropic layer with an ion beam from one surface to the other surface of the specific optically anisotropic layer, a profile of a secondary ion intensity derived from the leveling agent in a depth direction is obtained, a higher secondary ion intensity derived from the leveling agent, out of a secondary ion intensity derived from the leveling agent on one surface of the specific optically anisotropic layer and a secondary ion intensity derived from the leveling agent on the other surface of the specific optically anisotropic layer, is defined as a first intensity, the secondary ion intensity which is $1/1000$ of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of $1/500$ or more of the first intensity is observed at any depth of a region between the first position and the second position.

Hereinafter, the foregoing requirements will be described in detail with reference to the accompanying drawings. In the drawings shown below, the scale and the like are described in a form different from the actual data for the sake of making it easier to understand the content of the invention.

Figure 10:
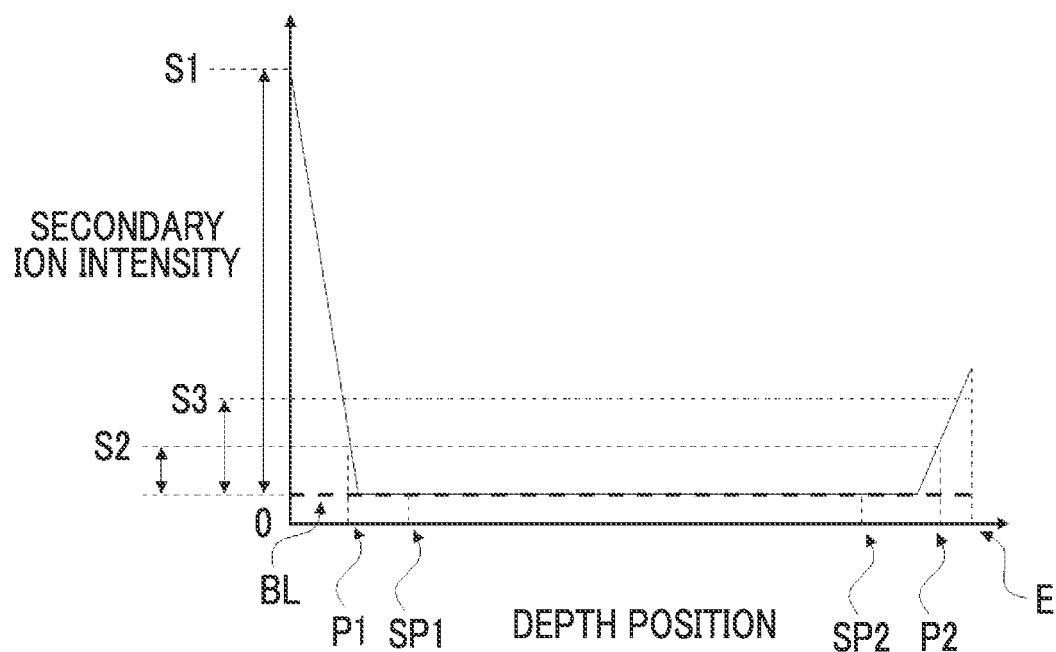
FIG. 10 is a schematic diagram for explaining a depth direction profile of a secondary ion intensity derived from a leveling agent detected by analyzing components of an optically anisotropic layer in a depth direction by time-of-flight secondary ion mass spectrometry (TOF-SIMS).

FIG. 10 shows an example of a profile obtained by analyzing the components in each layer in a depth direction by TOF-SIMS while ion-sputtering from one surface of the specific optically anisotropic layer to the other surface of the specific optically anisotropic layer. In the present specification, the depth direction is intended to mean a direction toward the other surface of the specific optically anisotropic layer with reference to one surface of the specific optically anisotropic layer.

In the profile in a depth direction shown in FIG. 10, a lateral axis (an axis extending in a left-right direction of a paper surface in FIG. 10) represents a depth with reference to one surface of the specific optically anisotropic layer, and a vertical axis (an axis extending in a vertical direction of a paper surface in FIG. 10) represents a secondary ion intensity derived from a leveling agent.

The TOF-SIMS method is specifically described in "Surface Analysis Technology Library Secondary Ion Mass Spectrometry" edited by the Surface Science Society of Japan and published by Maruzen Co., Ltd. (1999).

Figure 11:
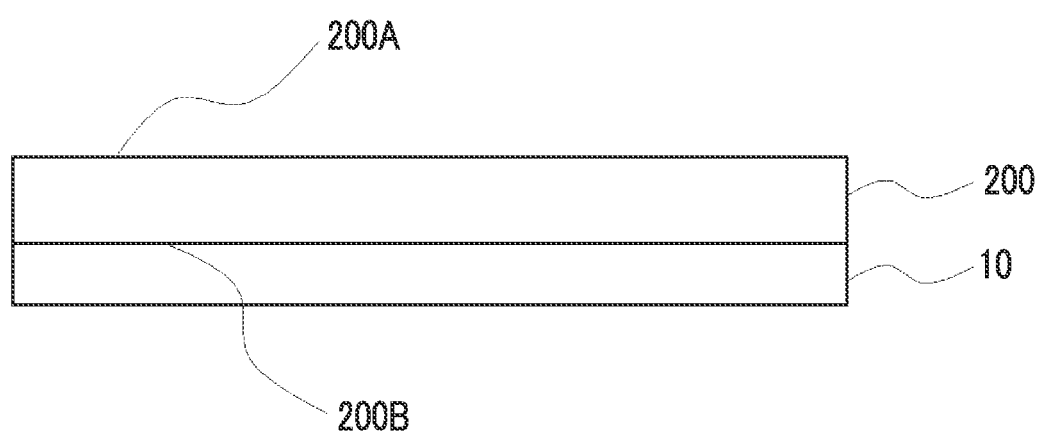
FIG. 11 is a schematic diagram showing an example of the optically anisotropic layer of FIG. 10.

The profile in FIG. 10 corresponds to the result of analyzing the components in each layer in a depth direction by TOF-SIMS while ion-sputtering from one surface 200A of a specific optically anisotropic layer 200 arranged on a substrate 10 (the surface of the specific optically anisotropic layer 200 opposite to the substrate 10) to the other surface 200B of the specific optically anisotropic layer 200 (the surface of the specific optically anisotropic layer 200 on the substrate 10 side), shown in FIG. 11.

The specific optically anisotropic layer 200 shown in FIG. 11 corresponds to an example of an aspect formed by applying a composition for forming an optically anisotropic layer containing predetermined components (a chiral agent, a liquid crystal compound, and a leveling agent) onto the substrate 10.

The position where the lateral axis is zero in FIG. 10 corresponds to the surface 200A of the specific optically anisotropic layer 200, and the position where the lateral axis is E corresponds to the surface 200B of the specific optically anisotropic layer 200. That is, zero to E on the lateral axis correspond to from one surface to the other surface of the specific optically anisotropic layer 200.

In a case of analyzing the components of the specific optically anisotropic layer in a depth direction by TOF-SIMS while irradiating the specific optically anisotropic layer with an ion beam, a series of operations are repeated including carrying out the component analysis in a surface depth region of 1 to 2 nm, then digging further in a depth direction from 1 nm to several hundred nm, and carrying out the component analysis in the next surface depth region of 1 to 2 nm.

The result of the secondary ion intensity derived from the leveling agent is shown in the profile in a depth direction shown in FIG. 10.

In the present specification, the "secondary ion intensity derived from the leveling agent" determined by the profile in a depth direction detected by analyzing the components of the specific optically anisotropic layer in a depth direction by TOF-SIMS is intended to mean an intensity of fragment ions derived from the leveling agent.

As shown in FIG. 10, in a case where the components of the specific optically anisotropic layer in a depth direction are analyzed by the TOF-SIMS method while irradiating the specific optically anisotropic layer with an ion beam from one surface of the specific optically anisotropic layer to the other surface of the specific optically anisotropic layer, first, the secondary ion intensity derived from the leveling agent is observed to be high, and in a case where the specific optically anisotropic layer is further irradiated with an ion beam in a depth direction, the intensity gradually decreases. Further, the secondary ion intensity derived from the leveling agent remains low toward the other surface side, and the intensity begins to increase as it approaches the other surface side.

Since the leveling agent tends to be unevenly distributed on an air interface side and a substrate interface side (particularly, an air interface side), the secondary ion intensity derived from the leveling agent tends to appear high in the vicinity of one surface and in the vicinity of the other surface as described above.

Next, a baseline is drawn in the profile obtained above to determine the standard for secondary ion intensity. Specifically, as shown in FIG. 10, a baseline BL indicated by a thick broken line is drawn, and this position is defined as a point where the secondary ion intensity is zero.

As a method of drawing the baseline, in a case where, first, a depth position corresponding to $1/10$ of the thickness of the entire specific optically anisotropic layer from one surface of the specific optically anisotropic layer toward the other surface side of the specific optically anisotropic layer is defined as a reference position SP1, and a depth position corresponding to 9/10 of the thickness of the entire specific optically anisotropic layer is defined as a reference position SP2, an average value of the secondary ion intensity derived from the leveling agent located between the reference position SP1 and the reference position SP2 is obtained and then the baseline is drawn with the average value. That is, an average value of the secondary ion intensity derived from the leveling agent in the region between the reference position SP1 and the reference position SP2 is calculated, a straight line indicating the average value is drawn along the lateral axis, and then this straight line is taken as the baseline.

Next, in the profile obtained above, a higher secondary ion intensity derived from the leveling agent, out of a secondary ion intensity derived from the leveling agent on one surface of the specific optically anisotropic layer and a secondary ion intensity derived from the leveling agent on the other surface of the specific optically anisotropic layer, is defined as the first intensity. In FIG. 10, since the secondary ion intensity (secondary ion intensity derived from the leveling agent whose depth position is zero in FIG. 10) derived from the leveling agent on one surface corresponding to the surface of the specific optically anisotropic layer opposite to the substrate is higher than the secondary ion intensity (secondary ion intensity derived from the leveling agent whose depth position is E in FIG. 10) derived from the leveling agent on the other surface corresponding to the surface of the specific optically anisotropic layer on the substrate side, the secondary ion intensity derived from the leveling agent on one surface corresponding to the surface of the specific optically anisotropic layer opposite to the substrate is defined as the first intensity S1.

As shown in FIG. 10, the first intensity S1 means an intensity with reference to the above-mentioned baseline BL. That is, the first intensity S1 is calculated with the position of the baseline BL as the secondary ion intensity of zero.

Next, the secondary ion intensity which is 1/1000 of the first intensity S1 is defined as the second intensity S2.

As the secondary ion intensity derived from the leveling agent on one surface of the specific optically anisotropic layer, the maximum value of the secondary ion intensity derived from the leveling agent in the region between one surface and 10 nm along a depth direction is adopted.

In addition, as the secondary ion intensity derived from the leveling agent on the other surface of the specific optically anisotropic layer, the maximum value of the secondary ion intensity derived from the leveling agent in the region between the other surface and 10 nm from the other surface toward one surface side is adopted.

Next, in the profile shown in FIG. 10, the depth position closest to the one substrate side showing the second intensity S2 is defined as the first position P1, and the depth position closest to the other substrate side showing the second intensity S2 is defined as the second position P2.

Next, the secondary ion intensity derived from the leveling agent is observed at the depth position of the region between the first position P1 and the second position P2. In the specific optically anisotropic layer, no secondary ion intensity derived from the leveling agent of 1/500 or more of the first intensity S1 is observed at any depth in the region between the first position P1 and the second position P2. More specifically, in FIG. 10, an intensity that is 1/500 of the first intensity S1 is shown as a third intensity S3, and it is observed that the secondary ion intensity derived from the leveling agent at any depth position in the region between the first position P1 and the second position P2 is not equal to or higher than the third intensity S3.

Peeling inside the specific optically anisotropic layer is suppressed by satisfying the foregoing requirements.

In a case where the secondary ion intensity derived from the leveling agent at any depth position in the region between the first position P1 and the second position P2 is equal to or higher than the third intensity S3, peeling is likely to occur in the vicinity of the depth position where the secondary ion intensity is equal to or higher than the third intensity S3.

The distribution state of the leveling agent as described above can be achieved by, for example, the above-mentioned procedure of the method for producing an optically anisotropic layer. More specifically, the specific optically anisotropic layer can be produced by carrying out the above-mentioned method for producing an optically anisotropic layer using a composition containing a chiral agent containing at least a photosensitive chiral agent whose helical twisting power changes upon irradiation with light, a liquid crystal compound having a polymerizable group, and a leveling agent. In the above-mentioned production method, an optically anisotropic layer having a plurality of regions in which the alignment states of the liquid crystal compound are different in a thickness direction can be realized by applying the composition once. Therefore, in the composition layer formed by applying the composition in such a procedure, the leveling agent tends to be unevenly distributed on the air interface side or the substrate side on which the composition is applied. As a result, in the optically anisotropic layer, the above-mentioned distribution state of the leveling agent can be achieved and a plurality of regions in which the alignment states of the liquid crystal compound are different can be formed in a thickness direction.

As for the specific optically anisotropic layer, the optically anisotropic layer satisfies the following requirement 1 or 2.

Requirement 1: The optically anisotropic layer has, in a thickness direction, a region in which an alignment state of the liquid crystal compound twist-aligned along a helical axis extending along a thickness direction is fixed, and a region in which an alignment state of a homogeneously aligned liquid crystal compound is fixed.

Requirement 2: The optically anisotropic layer has a plurality of regions along a thickness direction in which the alignment state of the liquid crystal compound twist-aligned along a helical axis extending along a thickness direction is fixed, and twisted angles of liquid crystal compounds in the plurality of regions are different from each other.

The specific optically anisotropic layer satisfying the requirement 1 corresponds to the above-mentioned optically anisotropic layer A.

The optical properties of the specific optically anisotropic layer satisfying the requirement 1 preferably exhibit the optical properties of the optically anisotropic layer A.

In a case where the specific optically anisotropic layer satisfying the requirement 1 includes two regions in which the alignment state of the liquid crystal compound twist-aligned along a helical axis extending along a thickness direction is fixed, it is preferable that the two included regions each satisfy the optical properties (relationship between twisted angle, And, ReB, and slow axis of liquid crystal compound) of the first optically anisotropic layer and the second optically anisotropic layer according to claim 1 or 6 of JP5960743B.

In addition, in a case where the specific optically anisotropic layer satisfying the requirement 2 includes two regions in which the alignment state of the liquid crystal compound twist-aligned along a helical axis extending along a thickness direction is fixed, one region is designated as region A, and the other region is designated as region B, the region A preferably satisfies Expression (3-1) assuming that the thickness of the region A is defined as dA and the refractive index anisotropy of the region A measured at a wavelength of 550 nm is defined as ΔA, from the viewpoint that an optically anisotropic layer can be suitably applied to a circularly polarizing plate.

$$205 \text{ nm} \leq \Delta n A d A \leq 345 \text{ nm} \quad \text{Expression (3-1)}$$

Above all, the region A more preferably satisfies Expression (3-2) and still more preferably Expression (3-3).

$$225 \text{ nm} \leq \Delta n A d A \leq 325 \text{ nm} \quad \text{Expression (3-2)}$$

$$245 \text{ nm} \leq \Delta n A d A \leq 305 \text{ nm} \quad \text{Expression (3-3)}$$

The absolute value of the twisted angle of liquid crystal compound in the region A is not particularly limited and is preferably more than 0° and 60° or less and more preferably 10 to 50° from the viewpoint that an optically anisotropic layer can be suitably applied to a circularly polarizing plate.

In a case where the thickness of the region B is defined as dB and the refractive index anisotropy of the region B measured at a wavelength of 550 nm is defined as ΔnB, the region B preferably satisfies Expression (4-1) from the viewpoint that an optically anisotropic layer can be suitably applied to a circularly polarizing plate.

$$70 \text{ nm} \leq \Delta n B d B \leq 210 \text{ nm} \quad \text{Expression (4-1)}$$

Above all, the region B more preferably satisfies Expression (4-2) and still more preferably Expression (4-3).

$$90 \text{ nm} \leq \Delta n B d B \leq 190 \text{ nm} \quad \text{Expression (4-2)}$$

$$110 \text{ nm} \leq \Delta n B d B \leq 170 \text{ nm} \quad \text{Expression (4-3)}$$

The absolute value of the twisted angle of liquid crystal compound in the region B is not particularly limited and is preferably 50 to 1100 and more preferably 60 to 100° from the viewpoint that an optically anisotropic layer can be suitably applied to a circularly polarizing plate.

In addition, in a case where the specific optically anisotropic layer satisfying the requirement 2 includes two regions in which the alignment state of the liquid crystal compound twist-aligned along a helical axis extending along a thickness direction is fixed, it is preferable that the two included regions satisfy the optical properties (relationship between twisted angle, Δn1d1, Δn2d2, and slow axis of liquid crystal compound) of the first optically anisotropic layer and the second optically anisotropic layer according to claim 1 or 5 of JP5753922B.

EXAMPLES

Hereinafter, features of the present invention will be described more specifically with reference to Examples and Comparative Examples. The materials, amounts used, proportions, treatment details, treatment procedure, and the like shown in the following Examples can be appropriately changed without departing from the spirit and scope of the present invention. Accordingly, the scope of the present invention should not be construed as being limited by the specific examples given below.

Example 1

(Preparation of Cellulose Acylate Film (Substrate))

The following composition was put into a mixing tank, stirred, and further heated at 90° C. for 10 minutes. Then, the obtained composition was filtered through a filter paper having an average pore diameter of 34 μm and a sintered metal filter having an average pore diameter of 10 μm to prepare a dope. The concentration of solid contents of the dope is 23.5% by mass, the amount of the plasticizer added is a proportion relative to cellulose acylate, and the solvent of the dope is methylene chloride/methanol/butanol=81/18/1 (in terms of a mass ratio).

| Cellulose acylate dope | |
|---|---|
| Cellulose acylate (acetyl substitution degree: 2.86, viscosity average degree of polymerization: 310) | 100 parts by mass |
| Sugar ester compound 1 (shown in Chemical Formula (S4)) | 6.0 parts by mass |
| Sugar ester compound 2 (shown in Chemical Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | |

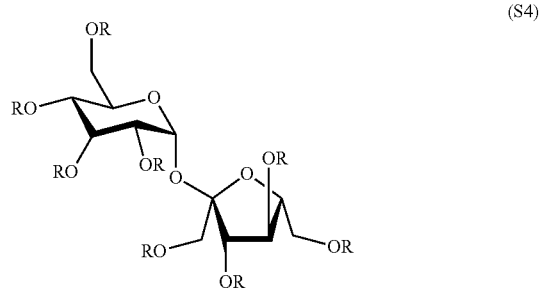

(S4)

(R = benzoyl or H
Average substitution degree: 5.7)

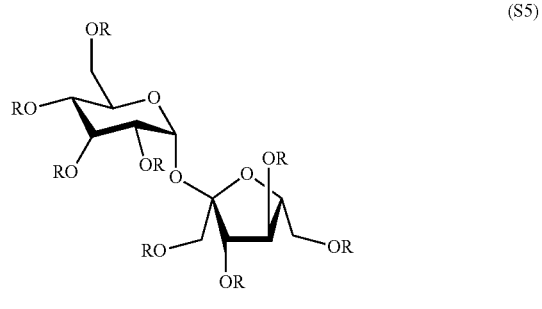

(S5)

(R = acetyl/isobutyryl = 2/6)

The dope prepared above was cast using a drum film forming machine. The dope was cast from a die such that it was in contact with a metal support cooled to 0° C., and then the obtained web (film) was stripped off. The drum was made of SUS.

The web (film) obtained by casting was peeled off from the drum and then dried in a tenter device for 20 minutes at 30° C. to 40° C. during film transport, using the tenter device that clips both ends of the web with clips to transport the film. Subsequently, the web was post-dried by zone heating while being rolled. The obtained web was knurled and then wound up.

The obtained cellulose acylate film had a film thickness of 40 μm, an in-plane retardation Re (550) of 1 nm at a wavelength of 550 nm, and a thickness direction retardation Rth (550) of 26 nm at a wavelength of 550 nm.
(Formation of Optically Anisotropic Layer)

The cellulose acylate film prepared above was continuously subjected to a rubbing treatment. At this time, the longitudinal direction and the transport direction of the elongated film were parallel, and the angle between the film longitudinal direction (transport direction) and the rubbing roller rotation axis was 74.5°. In a case where the film longitudinal direction (transport direction) is 90° and the clockwise direction is represented by a positive value with reference to a film width direction as a reference (0°) in a case of being observed from the film side, the rotation axis of the rubbing roller is at 15.5°. In other words, the position of the rotation axis of the rubbing roller is a position rotated by 74.5° counterclockwise with reference to the longitudinal direction of the film.

Using the rubbing-treated cellulose acylate film as a substrate, a composition (1) for forming an optically anisotropic layer containing a rod-like liquid crystal compound having the following composition was applied using a Geeser coating machine to form a composition layer (corresponding to a step 1). The absolute value of the weighted average helical twisting power of the chiral agent in the composition layer in the step 1 was 0.0 μm$^{-1}$.

Next, the obtained composition layer was heated at 80° C. for 60 seconds (corresponding to a step 2). This heating resulted in alignment of the rod-like liquid crystal compound of the composition layer in a predetermined direction.

Then, the composition layer was irradiated (irradiation amount: 70 mJ/cm$^2$) with ultraviolet rays using a 365 nm LED lamp (manufactured by AcroEdge Co., Ltd.) at 30° C. under oxygen-containing air (oxygen concentration: about 20% by volume) (corresponding to a step 3).

Subsequently, the obtained composition layer was heated at 80° C. for 10 seconds (corresponding to a step 5).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed (corresponding to a step 4). An optical film (F-1) was prepared in this manner.

The molar absorption coefficient of a left-twisted chiral agent (L1) at 365 nm in the composition (1) for forming an optically anisotropic layer was 1,900 L/(mol·cm), and the HTP of this chiral agent increased by 32 μm$^{-1}$ in a case of being irradiated (70 mJ/cm$^2$) with light of 365 nm, as compared with that before irradiation.

The molar absorption coefficient of a right-twisted chiral agent (R1) at 365 nm was 12,100 L/(mol·cm), and the HTP of this chiral agent decreased by 45 μm$^{-1}$ in a case of being irradiated (70 mJ/cm$^2$) with light of 365 nm, as compared with that before irradiation.

The photopolymerization initiator (Irgacure 907) had almost no absorption at 365 nm (molar absorption coefficient: 140 L/(mol·cm)), and a molar absorption coefficient of 18,600 L/(mol·cm) at an absorption peak wavelength of 306 nm.

| Composition (1) for forming optically anisotropic layer | |
|---|---|
| Rod-like liquid crystal compound (A) given below | 100 parts by mass |
| Ethylene oxide-modified trimethylolpropane triacrylate (V # 360, manufactured by Osaka Organic Chemical industry Ltd.) | 4 parts by mass |
| Photopolymerization initiator (Irgacure 907, manufactured by BASF SE) | 6 parts by mass |
| Left-twisted chiral agent (L1) given below | 0.32 parts by mass |
| Right-twisted chiral agent (R1) given below | 0.11 parts by mass |
| Polymerizable monomer (A) given below | 5 parts by mass |
| Polymerizable monomer (B) given below | 5 parts by mass |
| Polymer (A) given below | 0.25 parts by mass |
| Polymer (B) given below | 0.10 parts by mass |
| Butyl acetate | 325 parts by mass |

Rod-Like Liquid Crystal Compound (A)

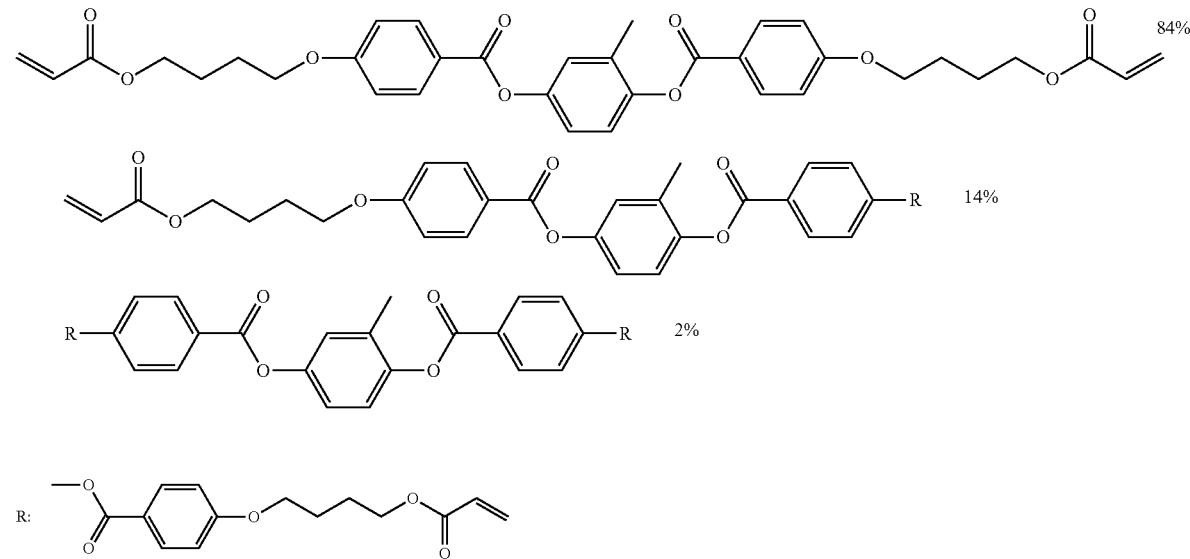

Left-Twisted Chiral Agent (L1)

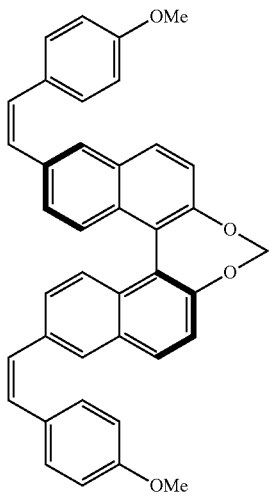

Right-Twisted Chiral Agent (R1)

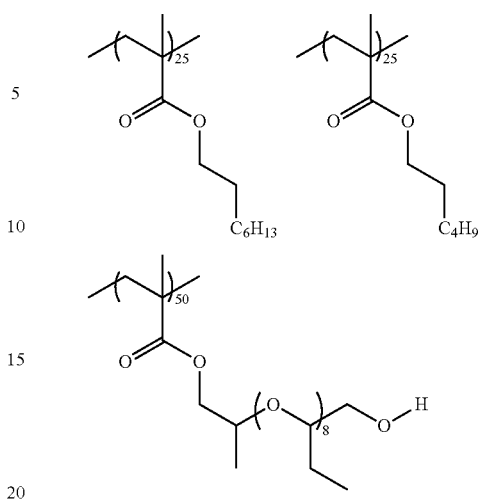

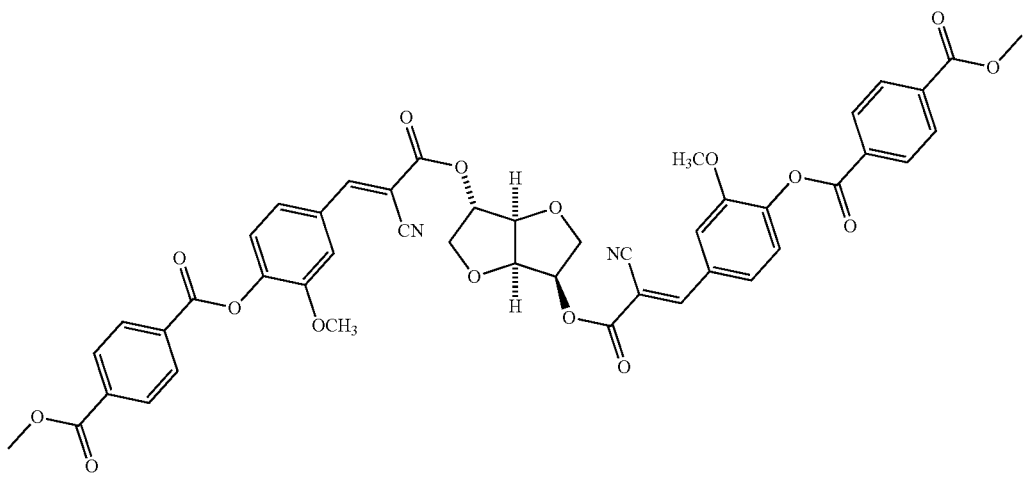

Polymerizable Monomer (A)

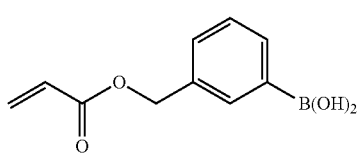

Polymerizable Monomer (B)

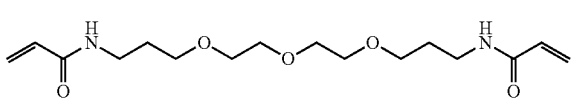 [SMILES: C=CC(=O)NCCCOCCOCCOCCCNC(=O)C=C]

Polymer (A) (In the formula, the numerical value described in each repeating unit represents the content (% by mass) of each repeating unit with respect to all the repeating units).

Polymer (B) (In the formula, the numerical value described in each repeating unit represents the content (% by mass) of each repeating unit with respect to all the repeating units).

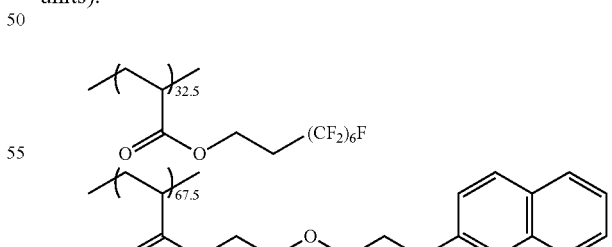

The optical film (F-1) prepared above was cut in parallel with the rubbing direction, and the optically anisotropic layer was observed from the cross-sectional direction with a polarization microscope. The thickness of the optically anisotropic layer was 2.3 μm, the region (second region) having a thickness (d2) of 1.2 μm on the optically anisotropic layer on the substrate side had a homogeneous alignment without a twisted angle, and the region (first region) having a thickness (d1) of 1.1 μm on the air side (side opposite to the substrate) of the optically anisotropic layer had a twisted alignment of the liquid crystal compound.

The optical properties of the optical film (F-1) were determined using Axoscan of Axometrics, Inc. and analysis software (Multi-Layer Analysis) of Axometrics, Inc. In the second region, the product (Δn2d2) of Δn2 and thickness d2 at a wavelength of 550 nm was 184 nm, the twisted angle of liquid crystal compound was 0°, and the alignment axis angle of liquid crystal compound with respect to a long longitudinal direction was −15.5° on the side in contact with the substrate and −15.5° on the side in contact with the first region.

In addition, in the first region, the product (Δn1d1) of Δn1 and thickness d1 at a wavelength of 550 nm was 165 nm, the twisted angle of liquid crystal compound was 88°, and the alignment axis angle of liquid crystal compound with respect to a long longitudinal direction was −15.5° on the side in contact with the second region and −103.5° on the air side.

The alignment axis angle of the liquid crystal compound contained in the optically anisotropic layer is expressed as negative in a case where it is clockwise (right-hand turning) and positive in a case where it is counterclockwise (left-hand turning) with the longitudinal direction of the substrate as a reference of 0°, upon observing the substrate from the surface side of the optically anisotropic layer.

In addition, the twisted structure of the liquid crystal compound here is expressed as negative in a case where the alignment axis direction of the liquid crystal compound on the substrate side (back side) is clockwise (right-hand turning) and positive in a case where it is counterclockwise (left-hand turning) with reference to the alignment axis direction of the liquid crystal compound on the surface side (front side), upon observing the substrate from the surface side of the optically anisotropic layer.

(Preparation of Polarizer)

A polyvinyl alcohol (PVA) film having a thickness of 80 μm was dyed by immersing it in an iodine aqueous solution having an iodine concentration of 0.05% by mass at 30° C. for 60 seconds. Next, the obtained film was machine-direction stretched 5 times its original length while immersed in a boric acid aqueous solution having a boric acid concentration of 4% by mass for 60 seconds, and then dried at 50° C. for 4 minutes to obtain a polarizer having a thickness of 20 sm.

(Preparation of Polarizer Protective Film)

A commercially available cellulose acylate-based film FUJITAC TG40UL (manufactured by FUJIFILM Corporation) was prepared and immersed at 1.5 mol/liter in a sodium hydroxide aqueous solution at 55° C., and then the sodium hydroxide was thoroughly washed away with water. Thereafter, the obtained film was immersed at 0.005 mol/liter in a dilute sulfuric acid aqueous solution at 35° C. for 1 minute, and then immersed in water to thoroughly wash away the dilute sulfuric acid aqueous solution. Finally, the obtained film was sufficiently dried at 120° C. to prepare a polarizer protective film whose surface was subjected to a saponification treatment.

(Preparation of Circularly Polarizing Plate)

The optical film (F-1) prepared above was subjected to a saponification treatment in the same manner as in the preparation of a polarizer protective film described above. Using a polyvinyl alcohol-based adhesive, the above-mentioned polarizer and the above-mentioned polarizer protective film were continuously bonded to the substrate surface contained in the optical film (F-1) to prepare a long circularly polarizing plate (P-1). That is, the circularly polarizing plate (P-1) had a polarizer protective film, a polarizer, a substrate, and an optically anisotropic layer in this order.

The absorption axis of the polarizer coincided with the longitudinal direction of the circularly polarizing plate, the rotation angle of the in-plane slow axis of the second region with respect to the absorption axis of the polarizer was 15.5°, and the rotation angle of the in-plane slow axis of the surface of the first region opposite to the second region side with respect to the absorption axis of the polarizer was 103.5°.

The rotation angle of the in-plane slow axis is represented by a positive angle value in a case where it is counterclockwise and a negative angle value in a case where it is clockwise with the longitudinal direction of the substrate as a reference of 0°, upon observing the optically anisotropic layer from the polarizer side.

Example 2

(Preparation of Positive C-Plate)

Using the above cellulose acylate film as a substrate, a composition (2) for forming an optically anisotropic layer shown in the given below was applied using a Geeser coating machine, and heated with hot air at 40° C. for 60 seconds to form a coating film. This was followed by nitrogen purging, and then the obtained coating film was irradiated (irradiation amount: 300 mJ/cm²) with ultraviolet rays using a metal halide lamp (manufactured by Eye Graphics Co., Ltd.) at 40° C. with an oxygen concentration of 100 ppm by volume to form a positive C-plate in which the alignment state of the liquid crystal compound was fixed. An optical film (F-2) was prepared in this manner.

The obtained positive C-plate had an in-plane retardation Re of 0 nm at a wavelength of 550 nm and a retardation Rth in a thickness direction of −60 nm.

| Composition (2) for forming optically anisotropic layer | |
|---|---|
| Rod-like liquid crystal compound (A) given above | 100 parts by mass |
| Ethylene oxide-modified trimethylolpropane triacrylate (V # 360, manufactured by Osaka Organic Chemical Industry Ltd.) | 8 parts by mass |
| Polymerization initiator (Irgacure 127, manufactured by BASF SE) | 2 parts by mass |
| Polymerization initiator (Irgacure OXE01, manufactured by BASF SE) | 4 parts by mass |
| Onium salt compound (A) given below | 2 parts by mass |
| Polymer (A) given above | 0.3 parts by mass |
| Polymer (C) given below | 0.4 parts by mass |
| Polymer (D) given below | 5 parts by mass |
| Toluene | 621 parts by mass |
| Methyl ethyl ketone | 69 parts by mass |

Polymer (C) (In the formula, the numerical value described in each repeating unit represents the content (% by mass) of each repeating unit with respect to all the repeating units).

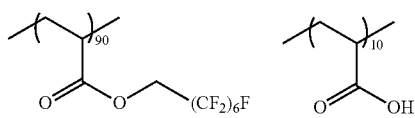

Polymer (D) (In the formula, the numerical value described in each repeating unit represents the content (% by mass) of each repeating unit with respect to all the repeating units).

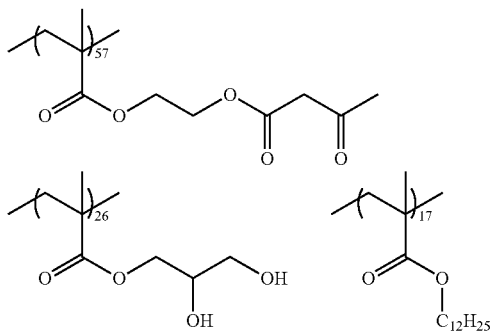

Onium Salt Compound (A)

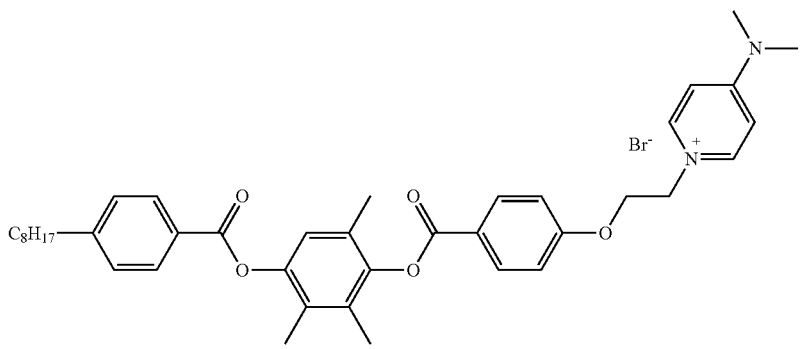

(Preparation of Circularly Polarizing Plate)

A pressure-sensitive adhesive was bonded onto the optically anisotropic layer contained in the above-mentioned circularly polarizing plate (P-1), the positive C-plate contained in the prepared optical film (F-2) was further bonded, and then the substrate contained in the optical film (F-2) was peeled off to prepare a long circularly polarizing plate (P-2). That is, the circularly polarizing plate (P-2) had a polarizer protective film, a polarizer, a substrate, an optically anisotropic layer, and a positive C-plate in this order.

Example 3

(Formation of Optically Anisotropic Layer)

The cellulose acylate film prepared in the same manner as in Example 1 was continuously subjected to a rubbing treatment. At this time, the longitudinal direction and the transport direction of the elongated film were parallel, and the angle between the film longitudinal direction (transport direction) and the rubbing roller rotation axis was 80°. In a case where the film longitudinal direction (transport direction) is 90° and the clockwise direction is represented by a positive value with reference to a film width direction as a reference (0°) in a case of being observed from the film side, the rotation axis of the rubbing roller is at 10°. In other words, the position of the rotation axis of the rubbing roller is a position rotated by 80° counterclockwise with reference to the longitudinal direction of the film.

Using the rubbing-treated cellulose acylate film as a substrate, a composition (3) for forming an optically anisotropic layer containing a rod-like liquid crystal compound having the following composition was applied using a Geeser coating machine to form a composition layer (corresponding to a step 1). The absolute value of the weighted average helical twisting power of the chiral agent in the composition layer in the step 1 was 0.0 µm$^{-1}$.

Next, the obtained composition layer was heated at 80° C. for 60 seconds (corresponding to a step 2). This heating resulted in alignment of the rod-like liquid crystal compound of the composition layer in a predetermined direction.

Then, the composition layer was irradiated (irradiation amount: 35 mJ/cm$^2$) with ultraviolet rays using a 365 nm LED lamp (manufactured by AcroEdge Co., Ltd.) at 30° C. under oxygen-containing air (oxygen concentration: about 20% by volume) (corresponding to a step 3).

Subsequently, the obtained composition layer was heated at 80° C. for 10 seconds (corresponding to a step 5).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed (corresponding to a step 4). An optical film (F-3) was prepared in this manner.

The molar absorption coefficient of a left-twisted chiral agent (L2) at 365 nm in the composition (3) for forming an optically anisotropic layer was 40 L/(mol·cm), and the HTP of this chiral agent did not change even in a case of being irradiated (35 mJ/cm$^2$) with light of 365 nm, as compared with that before irradiation.

The molar absorption coefficient of a right-twisted chiral agent (R2) at 365 nm was 38,450 L/(mol·cm), and the HTP of this chiral agent decreased by 35 µm$^{-1}$ in a case of being irradiated (35 mJ/cm$^2$) with light of 365 nm, as compared with that before irradiation.

The photopolymerization initiator (Irgacure 819) had a small absorption at 365 nm (molar absorption coefficient: 860 L/(mol·cm)) and a molar absorption coefficient of 7,700 L/(mol·cm) at an absorption peak wavelength of 290 nm.

| Composition (3) for forming optically anisotropic layer | |
|---|---|
| Rod-like liquid crystal compound (A) given above | 80 parts by mass |
| Rod-like liquid crystal compound (B) given below | 10 parts by mass |
| Polymerizable compound (C) given below | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-twisted chiral agent (L2) given below | 0.43 parts by mass |
| Right-twisted chiral agent (R2) given below | 0.38 parts by mass |
| Polymer (A) given above | 0.08 parts by mass |
| Polymer (E) given below | 0.50 parts by mass |

-continued
| Composition (3) for forming optically anisotropic layer | |
|---|---|
| Methyl isobutyl ketone | 116 parts by mass |
| Ethyl propionate | 40 parts by mass |
Rod-Like Liquid Crystal Compound (B)
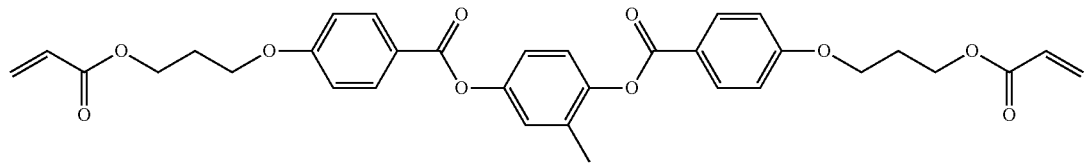 [SMILES: C=CC(=O)OCCCOc1ccc(C(=O)Oc2ccc(OC(=O)c3ccc(OCCCOC(=O)C=C)cc3)c(C)c2)cc1]
Polymerizable Compound (C)
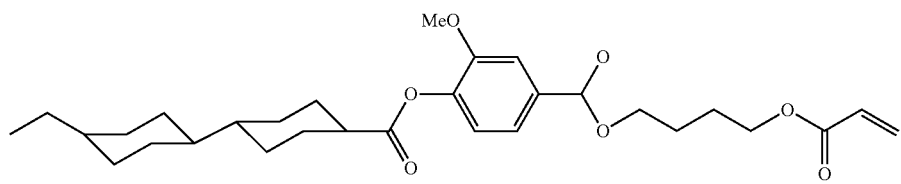 [SMILES: C=CC(=O)OCCCCOC(O)c1ccc(OC(=O)C2CCC(C3CCC(CC)CC3)CC2)c(OC)c1]
Left-Twisted Chiral Agent (L2)
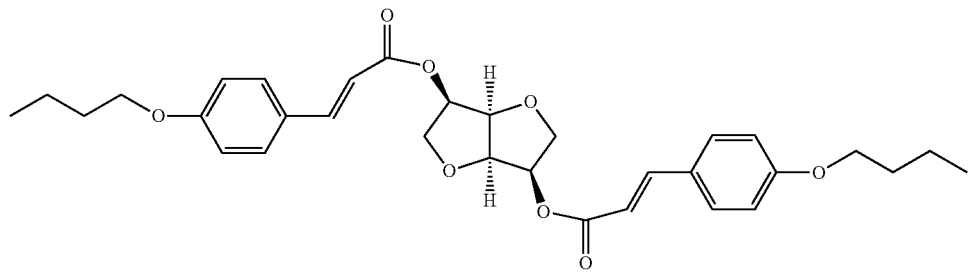 [SMILES: CCCCOc1ccc(/C=C/C(=O)O[C@@H]2CO[C@H]3[C@@H]2OC[C@H]3OC(=O)/C=C/c2ccc(OCCCC)cc2)cc1]
Right-Twisted Chiral Agent (R2)
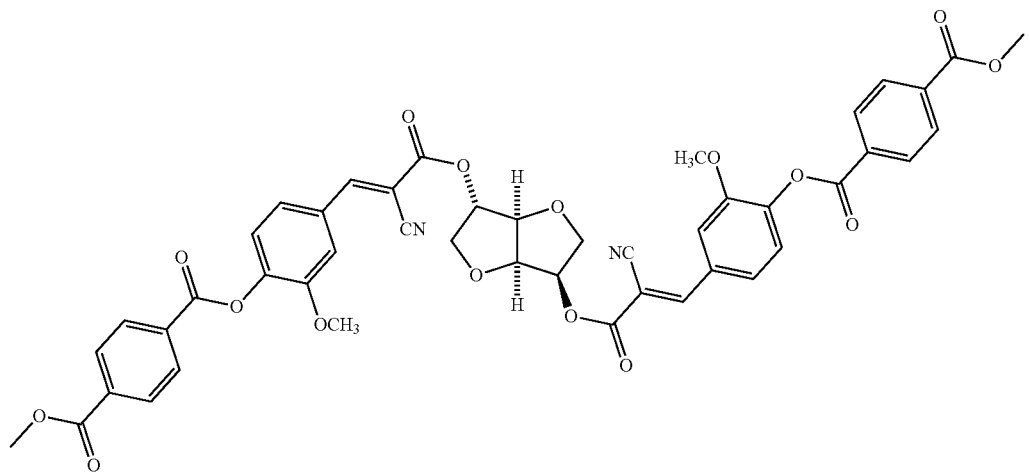

Polymer (E) (In the formula, the numerical value described in each repeating unit represents the content (% by mass) of each repeating unit with respect to all the repeating units).

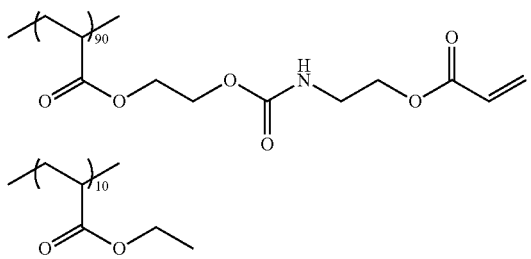

The optical film (F-3) prepared above was cut in parallel with the rubbing direction, and the optically anisotropic layer was observed from the cross-sectional direction with a polarization microscope. The thickness of the optically anisotropic layer was 2.7 μm, the region (second region) having a thickness (d2) of 1.3 μm on the optically anisotropic layer on the substrate side had a homogeneous alignment without a twisted angle, and the region (first region) having a thickness (d1) of 1.4 μm on the air side (side opposite to the substrate) of the optically anisotropic layer had a twisted alignment of the liquid crystal compound.

The optical properties of the optical film (F-3) were determined using Axoscan of Axometrics, Inc. and analysis software (Multi-Layer Analysis) of Axometrics, Inc. In the second region, the product (Δn2d2) of Δn2 and thickness d2 at a wavelength of 550 nm was 173 nm, the twisted angle of liquid crystal compound was 0°, and the alignment axis angle of liquid crystal compound with respect to a long longitudinal direction was −10° on the side in contact with the substrate and −10° on the side in contact with the first region.

In addition, in the first region, the product (Δn1d1) of Δn1 and thickness d1 at a wavelength of 550 nm was 184 nm, the twisted angle of liquid crystal compound was 75°, and the alignment axis angle of liquid crystal compound with respect to a long longitudinal direction was −10° on the side in contact with the second region and −85° on the air side.

(Preparation of Circularly Polarizing Plate)

The optical film (F-3) prepared above was subjected to a saponification treatment in the same manner as in Example 1. Using a polyvinyl alcohol-based adhesive, the above-mentioned polarizer and the above-mentioned polarizer protective film were continuously bonded to the substrate surface contained in the optical film (F-3) to prepare a long circularly polarizing plate (P-3). That is, the circularly polarizing plate (P-3) had a polarizer protective film, a polarizer, a substrate, and an optically anisotropic layer in this order.

The absorption axis of the polarizer coincided with the longitudinal direction of the circularly polarizing plate, the rotation angle of the in-plane slow axis of the second region with respect to the absorption axis of the polarizer was 10°, and the rotation angle of the in-plane slow axis of the surface of the first region opposite to the second region side with respect to the absorption axis of the polarizer was 85°.

Example 4

(Formation of Optically Anisotropic Layer)

The cellulose acylate film prepared in the same manner as in Example 1 was continuously subjected to a rubbing treatment. At this time, the longitudinal direction and the transport direction of the elongated film were parallel, and the angle between the film longitudinal direction (transport direction) and the rubbing roller rotation axis was 90°. In a case where the film longitudinal direction (transport direction) is 90° and the clockwise direction is represented by a positive value with reference to a film width direction as a reference (0°) in a case of being observed from the film side, the rotation axis of the rubbing roller is at 0°. In other words, the position of the rotation axis of the rubbing roller is a position rotated by 0° counterclockwise with reference to the longitudinal direction of the film.

Using the rubbing-treated cellulose acylate film as a substrate, a composition (4) for forming an optically anisotropic layer containing a rod-like liquid crystal compound having the following composition was applied using a Geeser coating machine to form a composition layer (corresponding to a step 1). The absolute value of the weighted average helical twisting power of the chiral agent in the composition layer in the step 1 was 0.03 μm$^{-1}$.

Next, the obtained composition layer was heated at 80° C. for 60 seconds (corresponding to a step 2). This heating resulted in alignment of the rod-like liquid crystal compound of the composition layer in a predetermined direction.

Then, the composition layer was irradiated (irradiation amount: 50 mJ/cm$^2$) with ultraviolet rays using a 365 nm LED lamp (manufactured by AcroEdge Co., Ltd.) at 30° C. under oxygen-containing air (oxygen concentration: about 20% by volume) (corresponding to a step 3).

Subsequently, the obtained composition layer was heated at 80° C. for 10 seconds (corresponding to a step 5).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed (corresponding to a step 4). An optical film (F-4) was prepared in this manner.

The HTP of the left-twisted chiral agent (L2) in the composition (4) for forming an optically anisotropic layer decreased by 1 μm$^{-1}$ in a case of being irradiated (50 mJ/cm$^2$) with light of 365 nm, as compared with that before irradiation.

The HTP of the right-twisted chiral agent (R2) decreased by 37 μm$^{-1}$ in a case of being irradiated (50 mJ/cm$^2$) with light of 365 nm, as compared with that before irradiation.

| Composition (4) for forming optically anisotropic layer | |
|---|---|
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-twisted chiral agent (L2) given above | 0.58 parts by mass |
| Right-twisted chiral agent (R2) given above | 0.39 parts by mass |
| Polymer (A) given above | 0.08 parts by mass |
| Polymer (E) given above | 0.50 parts by mass |
| Methyl isobutyl ketone | 121 parts by mass |
| Ethyl propionate | 41 parts by mass |

The optical film (F-4) prepared above was cut in parallel with the rubbing direction, and the optically anisotropic layer was observed from the cross-sectional direction with a polarization microscope. The thickness of the optically anisotropic layer was 3.1 μm, and both the region (second region) having a thickness (d2) of 2.1 μm on the optically anisotropic layer on the substrate side and the region (first region) having a thickness (d1) of 1.0 μm on the air side (side opposite to the substrate) of the optically anisotropic layer had a twisted alignment of the liquid crystal compound, but the twisted angles of the second region and the first region were different.

The optical properties of the optical film (F-4) were determined using Axoscan of Axometrics, Inc. and analysis software (Multi-Layer Analysis) of Axometrics, Inc. In the second region, the product (Δn2d2) of Δn2 and thickness d2 at a wavelength of 550 nm was 275 nm, the twisted angle of liquid crystal compound was 25°, and the alignment axis angle of liquid crystal compound with respect to a long longitudinal direction was 0° on the side in contact with the substrate and −25° on the side in contact with the first region.

In addition, in the first region, the product (Δn1d1) of Δn1 and thickness d1 at a wavelength of 550 nm was 138 nm, the twisted angle of liquid crystal compound was 79°, and the alignment axis angle of liquid crystal compound with respect to a long longitudinal direction was −25° on the side in contact with the second region and −104° on the air side.

(Preparation of Circularly Polarizing Plate)

The optical film (F-4) prepared above was subjected to a saponification treatment in the same manner as in Example 1. Using a polyvinyl alcohol-based adhesive, the above-mentioned polarizer and the above-mentioned polarizer protective film were continuously bonded to the substrate surface contained in the optical film (F-4) to prepare a long circularly polarizing plate (P-4). That is, the circularly polarizing plate (P-4) had a polarizer protective film, a polarizer, a substrate, and an optically anisotropic layer in this order.

The absorption axis of the polarizer coincided with the longitudinal direction of the circularly polarizing plate, the rotation angle of the in-plane slow axis of the second region with respect to the absorption axis of the polarizer was 0°, and the rotation angle of the in-plane slow axis of the surface of the first region opposite to the second region side with respect to the absorption axis of the polarizer was 104°.

Example 5

(Alkali Saponification Treatment)

After passing the above-mentioned cellulose acylate film through a dielectric heating roll at a temperature of 60° C. to raise the film surface temperature to 40° C., an alkaline solution having the composition shown below was applied onto a band surface of the film using a bar coater at a coating amount of 14 ml/m², followed by heating to 110° C., and transportation under a steam type far-infrared heater manufactured by Noritake Company Limited for 10 seconds. Subsequently, pure water was applied at 3 ml/m² using the same bar coater. Then, after repeating washing with water with a fountain coater and draining with an air knife three times, the film was transported to a drying zone at 70° C. for 10 seconds and dried to prepare a cellulose acylate film subjected to an alkali saponification treatment.

| Alkaline solution | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 parts by mass |
| Propylene glycol | 14.8 parts by mass |

(Formation of Alignment Film)

An alignment film coating liquid having the following composition was continuously applied onto the surface of the cellulose acylate film that had been subjected to the alkali saponification treatment with a #14 wire bar. The film was dried with hot air at 60° C. for 60 seconds and further with hot air at 100° C. for 120 seconds. The degree of saponification of the modified polyvinyl alcohol used was 96.8%.

| Alignment film coating liquid | |
|---|---|
| Modified polyvinyl alcohol-1 given below | 10 parts by mass |
| Water | 170 parts by mass |
| Methanol | 57 parts by mass |

Modified polyvinyl alcohol-1 (In the formula, the numerical value described in each repeating unit represents the content (mol %) of each repeating unit with respect to all the repeating units).

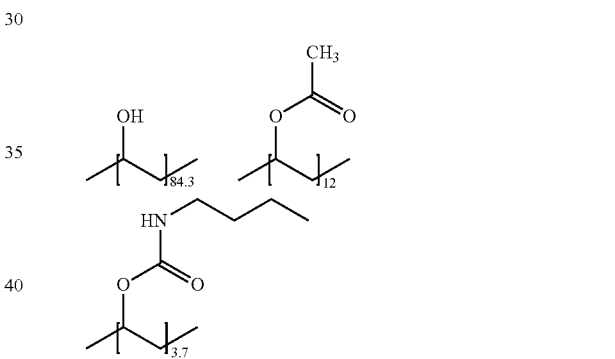

(Formation of Optically Anisotropic Layer)

The alignment film prepared above was continuously subjected to a rubbing treatment. At this time, the longitudinal direction and the transport direction of the elongated film were parallel, and the angle between the film longitudinal direction (transport direction) and the rubbing roller rotation axis was 78°. In a case where the film longitudinal direction (transport direction) is 90° and the clockwise direction is represented by a positive value with reference to a film width direction as a reference (0°) in a case of being observed from the film side, the rotation axis of the rubbing roller is at 12°. In other words, the position of the rotation axis of the rubbing roller is a position rotated by 78° counterclockwise with reference to the longitudinal direction of the film.

Using the rubbing-treated cellulose acylate film as a substrate, a composition (5) for forming an optically anisotropic layer containing a rod-like liquid crystal compound having the following composition was applied using a Geeser coating machine to form a composition layer (corresponding to a step 1). The absolute value of the weighted average helical twisting power of the chiral agent in the composition layer in the step 1 was 0.0 μm$^{-1}$.

Next, the obtained composition layer was heated at 80° C. for 60 seconds (corresponding to a step 2). This heating resulted in alignment of the rod-like liquid crystal compound of the composition layer in a predetermined direction.

Then, the composition layer was irradiated (irradiation amount: 35 mJ/cm$^2$) with ultraviolet rays using a 365 nm LED lamp (manufactured by AcroEdge Co., Ltd.) at 30° C. under oxygen-containing air (oxygen concentration: about 20% by volume) (corresponding to a step 3).

Subsequently, the obtained composition layer was heated at 80° C. for 10 seconds (corresponding to a step 5).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed (corresponding to a step 4). An optical film (F-5) was prepared in this manner.

| Composition (5) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-twisted chiral agent (L2) given above | 0.47 parts by mass |
| Right-twisted chiral agent (R2) given above | 0.42 parts by mass |
| Polymer (A) given above | 0.08 parts by mass |
| Methyl ethyl ketone | 156 parts by mass |

The optical film (F-5) prepared above was cut in parallel with the rubbing direction, and the optically anisotropic layer was observed from the cross-sectional direction with a polarization microscope. The thickness of the optically anisotropic layer was 2.7 μm, the region (second region) having a thickness (d2) of 1.3 μm on the optically anisotropic layer on the substrate side had a homogeneous alignment without a twisted angle, and the region (first region) having a thickness (d1) of 1.4 μm on the air side (side opposite to the substrate) of the optically anisotropic layer had a twisted alignment of the liquid crystal compound.

The optical properties of the optical film (F-5) were determined using Axoscan of Axometrics, Inc. and analysis software (Multi-Layer Analysis) of Axometrics, Inc. In the second region, the product ($\Delta n2 d2$) of $\Delta n2$ and thickness d2 at a wavelength of 550 nm was 175 nm, the twisted angle of liquid crystal compound was 0°, and the alignment axis angle of liquid crystal compound with respect to a long longitudinal direction was −12° on the side in contact with the substrate and −12° on the side in contact with the first region.

In addition, in the first region, the product ($\Delta n1 d1$) of $\Delta n1$ and thickness d1 at a wavelength of 550 nm was 182 nm, the twisted angle of liquid crystal compound was 79°, and the alignment axis angle of liquid crystal compound with respect to a long longitudinal direction was −12° on the side in contact with the second region and −91° on the air side.

(Preparation of Circularly Polarizing Plate)

A pressure-sensitive adhesive layer formed on a long support (separator) and the air-side surface (surface opposite to the substrate) of the optically anisotropic layer contained in the optical film (F-5) prepared above were continuously bonded to each other, and then the substrate contained in the optical film (F-5) was peeled off. At this time, the substrate was peeled off at the interface between the second region and the alignment film of the optically anisotropic layer contained in the optical film (F-5). The surface of the second region in contact with the alignment film exposed in this manner, the above-mentioned polarizer, and the above-mentioned polarizer protective film were continuously bonded together using an ultraviolet curable adhesive to prepare a long circularly polarizing plate (P-5). That is, the circularly polarizing plate (P-5) had a polarizer protective film, a polarizer, an optically anisotropic layer, a pressure-sensitive adhesive layer, and a separator in this order.

The absorption axis of the polarizer coincided with the longitudinal direction of the circularly polarizing plate, the rotation angle of the in-plane slow axis of the second region with respect to the absorption axis of the polarizer was 12°, and the rotation angle of the in-plane slow axis of the surface of the first region opposite to the second region side with respect to the absorption axis of the polarizer was 91°.

Comparative Example 1

An optical film (C-1) was prepared in the same manner as in the method for preparing the optical film (F-1), except that, in Example 1 described above, the step 3 was carried out under nitrogen purging (oxygen concentration: 100 ppm by volume) instead of carrying out irradiation with a 365 nm LED lamp under oxygen-containing air (oxygen concentration: about 20% by volume).

In a case where the cross section of the optically anisotropic layer was observed according to the same procedure as in Example 1, the homogeneous alignment was formed over the entire thickness direction of the obtained optically anisotropic layer and therefore the desired effect of the present invention could not be obtained.

The in-plane retardation Re ($\lambda$) of the prepared optically anisotropic layer at a wavelength $\lambda$ was measured with Axoscan (manufactured by Axometrics, Inc.). The results are shown in Table 1.

<Preparation of Organic EL Display Device and Evaluation of Display Performance>

(Mounting on Display Device)

The SAMSUNG GALAXY S4 equipped with an organic EL panel was disassembled, a circularly polarizing plate was peeled off, and each of circularly polarizing plates (P-1) to (P-5) prepared in the foregoing Examples was attached to the display device such that the polarizer protective film was placed on the outside.

(Evaluation of Display Performance)

(Front Direction)

The prepared organic EL display device was displayed in black and observed from the front under bright light, and the tint variation was evaluated according to the following standards. The results are shown in Table 1.

4: The tint variation is not visible at all (acceptable).
3: Although the tint variation is visible, it is very slight (acceptable).
2: The tint variation is slightly visible and there is some reflected light, which is unacceptable.
1: The tint variation is visible and there is a lot of reflected light, which is unacceptable.

(Oblique Direction)

The prepared organic EL display device was displayed in black, a fluorescent lamp is projected from a polar angle of 45° under bright light, and the reflected light was observed from all directions. The azimuthal angle dependence of the tint change was evaluated according to the following standards. The results are shown in Table 1.
  4: The tint difference is not visible at all (acceptable).
  3: Although the tint difference is visible, it is very slight (acceptable).
  2: The tint difference is visible, but the reflected light is small and there is no problem in use (acceptable).
  1: The tint difference is visible and there is a lot of reflected light, which is unacceptable.

In Table 1, the column of "Oxygen concentration" represents an oxygen concentration in the step 3.

The column of "Presence/absence of C-plate" represents whether or not the prepared circularly polarizing plate contains a positive C-plate.

In the "Presence/absence of plurality of alignment regions" column, the case where an optically anisotropic layer having a plurality of regions in which fixed alignment states of the liquid crystal compound are different along a thickness direction is formed is expressed as "Presence", and the case where such an optically anisotropic layer is not formed (in a case where there are no plurality of regions having different alignment states in the optically anisotropic layer) is expressed as "Absence".

anisotropic layer containing a rod-like liquid crystal compound having the following composition was applied using a Geeser coating machine to form a composition layer.

Next, the obtained composition layer was heated at 100° C. for 60 seconds. This heating resulted in alignment of the rod-like liquid crystal compound of the composition layer in a predetermined direction.

This was followed by nitrogen purging, and then the composition layer was irradiated (irradiation amount: 200 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed.

Then, the composition (C2-2) for forming an optically anisotropic layer containing a rod-like liquid crystal compound was applied onto the optically anisotropic layer using a Geeser coating machine to form a composition layer.

Next, the obtained composition layer was heated at 100° C. for 60 seconds (corresponding to a step 2). This heating resulted in alignment of the rod-like liquid crystal compound of the composition layer in a predetermined direction.

TABLE 1

| | Oxygen concentration | Presence/absence of C-plate | In-plane retardation Re(450) | Re(550) | Re(650) | Presence/absence of plurality of alignment regions | Evaluation of visibility Front direction | Oblique direction |
|---|---|---|---|---|---|---|---|---|
| Example 1 | 20% by volume | Absence | 100 nm | 135 nm | 149 nm | Presence | 4 | 2 |
| Example 2 | 20% by volume | Presence | 100 nm | 135 nm | 149 nm | Presence | 4 | 4 |
| Example 3 | 20% by volume | Absence | 122 nm | 141 nm | 150 nm | Presence | 4 | 2 |
| Example 4 | 20% by volume | Absence | 112 nm | 139 nm | 150 nm | Presence | 4 | 2 |
| Example 5 | 20% by volume | Absence | 118 nm | 140 nm | 151 nm | Presence | 4 | 2 |
| Comparative Example 1 | 100 ppm by volume | Absence | 379 nm | 350 nm | 338 nm | Absence | — | — |

As shown in Table 1 above, it was confirmed that the phase difference of the optically anisotropic layer according to the embodiment of the present invention exhibited reverse wavelength dispersibility, and then in a case where this optically anisotropic layer was used in an organic EL display device, tint variation and reflection were suppressed.

Comparative Example 2

The cellulose acylate film prepared above was continuously subjected to a rubbing treatment. At this time, the longitudinal direction and the transport direction of the elongated film were parallel, and the angle between the film longitudinal direction (transport direction) and the rubbing roller rotation axis was 80°. In a case where the film longitudinal direction (transport direction) is 90° and the clockwise direction is represented by a positive value with reference to a film width direction as a reference (0°) in a case of being observed from the film side, the rotation axis of the rubbing roller is at 10°. In other words, the position of the rotation axis of the rubbing roller is a position rotated by 80° counterclockwise with reference to the longitudinal direction of the film.

Using the rubbing-treated cellulose acylate film as a substrate, a composition (C2-1) for forming an optically This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed. An optical film (C-2) was prepared in this manner.

| Composition (C2-1) for forming optically anisotropic layer | |
|---|---|
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.016 parts by mass |
| Polymer (E) given above | 1.00 parts by mass |
| Methyl isobutyl ketone | 116 parts by mass |
| Ethyl propionate | 40 parts by mass |

| Composition of composition (C2-2) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-twisted chiral agent (L1) given above | 0.20 parts by mass |
| Polymer (A) given below | 0.16 parts by mass |
| Methyl isobutyl ketone | 116 parts by mass |
| Ethyl propionate | 40 parts by mass |

Comparative Example 3

An optical film (C-3) was produced according to the same procedure as in Comparative Example 1, except that the composition (C3) for forming an optically anisotropic layer was used instead of the composition (C2-1) for forming an optically anisotropic layer.

| Composition (C-3) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.0016 parts by mass |
| Polymer (E) given above | 1.00 parts by mass |
| Methyl isobutyl ketone | 116 parts by mass |
| Ethyl propionate | 40 parts by mass |

Comparative Example 4

An optical film (C-4) was produced according to the same procedure as in Comparative Example 1, except that the composition (C4) for forming an optically anisotropic layer was used instead of the composition (C2-1) for forming an optically anisotropic layer.

| Composition (C-4) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.0004 parts by mass |
| Polymer (E) given above | 1.00 parts by mass |
| Methyl isobutyl ketone | 116 parts by mass |
| Ethyl propionate | 40 parts by mass |

The optical films (C-2) to (C-4) prepared above were cut in parallel with the rubbing direction, and the optically anisotropic layer was observed from the cross-sectional direction with a polarization microscope. The thickness of the optically anisotropic layer was 2.7 μm, the region (second region) having a thickness (d2) of 1.3 μm on the optically anisotropic layer on the substrate side had a homogeneous alignment without a twisted angle, and the region (first region) having a thickness (d1) of 1.4 μm on the air side (side opposite to the substrate) of the optically anisotropic layer had a twisted alignment of the liquid crystal compound.

The optical properties of the optical films (C-2) to (C-4) were determined using Axoscan of Axometrics, Inc. and analysis software (Multi-Layer Analysis) of Axometrics, Inc. In the second region, the product ($\Delta n2 d2$) of $\Delta n2$ and thickness d2 at a wavelength of 550 nm was 173 nm, the twisted angle of liquid crystal compound was 0°, and the alignment axis angle of liquid crystal compound with respect to a long longitudinal direction was −40° on the side in contact with the substrate and −10° on the side in contact with the first region.

In addition, in the first region, the product ($\Delta n1 d1$) of $\Delta n1$ and thickness d1 at a wavelength of 550 nm was 184 nm, the twisted angle of liquid crystal compound was 75°, and the alignment axis angle of liquid crystal compound with respect to a long longitudinal direction was −10° on the side in contact with the second region and −85° on the air side.

The alignment axis angle of the liquid crystal compound contained in the optically anisotropic layer is expressed as negative in a case where it is clockwise (right-hand turning) and positive in a case where it is counterclockwise (left-hand turning) with the longitudinal direction of the film as a reference of 0°, upon observing the film from the surface side of the optically anisotropic layer.

In addition, the twisted structure of the liquid crystal compound here is expressed as negative in a case where the alignment direction of the liquid crystal compound on the substrate side (back side) is clockwise (right-hand turning) and positive in a case where it is counterclockwise (left-hand turning) with reference to the alignment direction of the liquid crystal compound on the surface side (front side), upon observing the substrate from the surface side of the optically anisotropic layer.

In addition, regarding the optically anisotropic layers of Example 3 and Comparative Examples 2 to 4, as described above, while cutting the film in the depth direction of the optically anisotropic layer with an $Ar^+$ cluster gun, the components in a depth direction were analyzed by a time-of-flight secondary ion mass spectrometer (TOF-SIMS) ("SIMS5" manufactured by IONTOF GmbH).

In the optically anisotropic layer of Example 3, the profile as shown in FIG. 10 was obtained, and no secondary ion intensity derived from the leveling agent of 1/500 or more of the first intensity was observed at any depth of the region between the first position and the second position.

In the column of "Secondary ion intensity" in the table which will be given later, the case where the secondary ion intensity derived from the leveling agent of 1/500 or more of the first intensity was not observed at any depth of the region between the first position and the second position is expressed as "A", and the case where such a secondary ion intensity was observed is expressed as "B".

In Comparative Examples 2 to 4, the maximum values of the secondary ion intensity derived from the leveling agent observed in the region between the first position and the second position were 1/12, 1/120, and 1/400 of the first intensity, respectively.

<Evaluation of Peelability>

In a case where a cross cut 100-square test was carried out on the optically anisotropic layer of the obtained optical film and CELLOTAPE (registered trademark) (No. 405, manufactured by Nichiban Co., Ltd.) peeling was carried out five times, the number of squares from which more than half of the area was peeled off was counted and evaluated according to the following standards. For the marking depth of the cross cut, the cross section was observed with an optical microscope. A notch was formed at a depth of ¾ or more in the film thickness direction of the optically anisotropic layer, and marking was carried out by applying a pressure to a marking blade such that the notch did not reach the substrate.

Practically, it is preferably a rating of A.

A: The number of peeled squares is 0 or more and less than 10.
B: The number of peeled squares is 10 or more and less than 30.
C: The number of peeled squares is 30 or more and less than 50.
D: The number of peeled squares is 50 or more.

TABLE 2

| | Optical film | Secondary ion intensity | Peelability |
|---|---|---|---|
| Example 3 | F-3 | A | A |
| Comparative Example 2 | C-2 | B | D |
| Comparative Example 3 | C-3 | B | C |
| Comparative Example 4 | C-4 | B | B |

As shown in the above table, the desired effect was obtained in the optically anisotropic layer according to the embodiment of the present invention.

On the other hand, in Comparative Examples, the peeling of the square occurred, and as a result of observing the peeling position of the peeled square with an optical microscope in cross section, the peeling occurred inside the optically anisotropic layer.

Comparative Example 5

The cellulose acylate film prepared above was continuously subjected to a rubbing treatment. At this time, the longitudinal direction and the transport direction of the elongated film were parallel, and the angle between the film longitudinal direction (transport direction) and the rubbing roller rotation axis was 90°. In a case where the film longitudinal direction (transport direction) is 90° and the clockwise direction is represented by a positive value with reference to a film width direction as a reference (0°) in a case of being observed from the film side, the rotation axis of the rubbing roller is at 0°. In other words, the position of the rotation axis of the rubbing roller is a position rotated by 0° counterclockwise with reference to the longitudinal direction of the film.

Using the rubbing-treated cellulose acylate film as a substrate, a composition (C5-1) for forming an optically anisotropic layer containing a rod-like liquid crystal compound having the following composition was applied using a Geeser coating machine to form a composition layer.

Next, the obtained composition layer was heated at 100° C. for 60 seconds. This heating resulted in alignment of the rod-like liquid crystal compound of the composition layer in a predetermined direction.

This was followed by nitrogen purging, and then the composition layer was irradiated (irradiation amount: 200 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed.

Then, the composition (C5-2) for forming an optically anisotropic layer containing a rod-like liquid crystal compound was applied onto the optically anisotropic layer using a Geeser coating machine to form a composition layer.

Next, the obtained composition layer was heated at 100° C. for 60 seconds. This heating resulted in alignment of the rod-like liquid crystal compound of the composition layer in a predetermined direction.

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed. An optical film (C-5) was prepared in this manner.

The optical film (C-5) prepared above was cut in parallel with the rubbing direction, and the optically anisotropic layer was observed from the cross-sectional direction with a polarization microscope. The thickness of the optically anisotropic layer was 3.1 μm, and both the region (second region) having a thickness (d2) of 2.1 μm on the optically anisotropic layer on the substrate side and the region (first region) having a thickness (d1) of 1.0 μm on the air side (side opposite to the substrate) of the optically anisotropic layer had a twisted alignment of the liquid crystal compound, but the twisted angles of the second region and the first region were different.

The optical properties of the optical film (F-4) were determined using Axoscan of Axometrics, Inc. and analysis software (Multi-Layer Analysis) of Axometrics, Inc. In the second region, the product ($\Delta n2 d2$) of $\Delta n2$ and thickness d2 at a wavelength of 550 nm was 275 nm, the twisted angle of liquid crystal compound was 25°, and the alignment axis angle of liquid crystal compound with respect to a long longitudinal direction was 0° on the side in contact with the substrate and −25° on the side in contact with the first region.

In addition, in the first region, the product ($\Delta n1 d1$) of $\Delta n1$ and thickness d1 at a wavelength of 550 nm was 138 nm, the twisted angle of liquid crystal compound was 79°, and the alignment axis angle of liquid crystal compound with respect to a long longitudinal direction was −25° on the side in contact with the second region and −104° on the air side.

The alignment axis angle of the liquid crystal compound contained in the optically anisotropic layer is expressed as negative in a case where it is clockwise (right-hand turning) and positive in a case where it is counterclockwise (left-hand turning) with the longitudinal direction of the film as a reference of 0°, upon observing the film from the surface side of the optically anisotropic layer.

In addition, the twisted structure of the liquid crystal compound here is expressed as negative in a case where the alignment direction of the liquid crystal compound on the substrate side (back side) is clockwise (right-hand turning) and positive in a case where it is counterclockwise (left-hand turning) with reference to the alignment direction of the liquid crystal compound on the surface side (front side), upon observing the substrate from the surface side of the optically anisotropic layer.

| Composition (C5-1) for forming optically anisotropic layer | |
|---|---|
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane | 4 parts by mass |

-continued

| Composition (C5-1) for forming optically anisotropic layer | |
|---|---|
| triacrylate (V # 360, manufactured by Osaka Organic Chemical Industry Ltd.) | |
| Photopolymerization initiator (Irgacure 819, manufactured by BASF SE) | 3 parts by mass |
| Left-twisted chiral agent (L2) given above | 0.58 parts by mass |
| Right-twisted chiral agent (R2) given above | 0.39 parts by mass |
| Polymer (A) given above | 0.0003 parts by mass |
| Polymer (E) given above | 0.50 parts by mass |
| Methyl isobutyl ketone | 121 parts by mass |
| Ethyl propionate | 41 parts by mass |

| Composition (C5-2) for forming optically anisotropic layer | |
|---|---|
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-twisted chiral agent (L2) given above | 0.58 parts by mass |
| Right-twisted chiral agent (R2) given above | 0.05 parts by mass |
| Polymer (A) given above | 0.25 parts by mass |
| Methyl isobutyl ketone | 121 parts by mass |
| Ethyl propionate | 41 parts by mass |

The above-mentioned analysis by TOF-SIMS and <Evaluation of peelability> were carried out using the obtained optical film. The results are shown in Table 3. In Example 4, only the secondary ion intensity derived from the leveling agent of 1/1000 or less of the first intensity was observed at any depth of the region between the first position and the second position.

In addition, in Comparative Example 5, the maximum value of the secondary ion intensity derived from the leveling agent observed in the region between the first position and the second position was 1/400 of the first intensity.

TABLE 3

| | Optical film | Secondary ion intensity | Peelability |
|---|---|---|---|
| Example 4 | F-4 | A | A |
| Comparative Example 5 | C-5 | B | B |

As shown in the above table, the desired effect was obtained in the optically anisotropic layer according to the embodiment of the present invention.

On the other hand, in Comparative Examples, the peeling of the square occurred, and as a result of observing the peeling position of the peeled square with an optical microscope in cross section, the peeling occurred inside the optically anisotropic layer.

EXPLANATION OF REFERENCES

10: substrate
12, 120: composition layer
12A, 120A: lower region
12B, 120B: upper region
20, 200: optically anisotropic layer
22: another optically anisotropic layer
24: laminate
26: polarizer
28: optically anisotropic layer with polarizer

What is claimed is:

1. A method for producing an optically anisotropic layer, comprising:
   a step 1 of forming a composition layer containing a chiral agent containing at least a photosensitive chiral agent whose helical twisting power changes upon irradiation with light and a liquid crystal compound having a polymerizable group on a substrate;
   a step 2 of subjecting the composition layer to a heat treatment to align the liquid crystal compound in the composition layer;
   a step 3 of subjecting the composition layer to light irradiation under a condition of an oxygen concentration of 1% by volume or more, after the step 2; and
   a step 4 of subjecting the light-irradiated composition layer to a curing treatment to fix an alignment state of the liquid crystal compound to form an optically anisotropic layer having a plurality of regions having different alignment states of the liquid crystal compound along a thickness direction,
   wherein a step 5 of carrying out the step 3 under heating conditions, or subjecting the composition layer to a heat treatment between the step 3 and the step 4 is further provided,
   a total content of the chiral agent with respect to a total mass of the liquid crystal compound is 5.0% by mass or less, and
   wherein the composition layer contains two or more chiral agents, and
   an absolute value of a weighted average helical twisting power of the two or more chiral agents in the composition layer in the step 1 is 0.0 to 1.9 $\mu m^{-1}$.

2. The method for producing an optically anisotropic layer according to claim 1,
   wherein the total content of the chiral agent with respect to the total mass of the liquid crystal compound is 1.0% by mass or less.

3. The method for producing an optically anisotropic layer according to claim 2,
   wherein the absolute value of a weighted average helical twisting power of the two or more chiral agents in the composition layer in the step 1 is 0.0 to 0.5 $\mu m^{-1}$.

4. The method for producing an optically anisotropic layer according to claim 3,
   wherein the optically anisotropic layer has, along a thickness direction, a first region in which the alignment state of the liquid crystal compound twist-aligned along a helical axis extending along a thickness direction is fixed, and a second region in which the alignment state of a homogeneously aligned liquid crystal compound is fixed.

5. The method for producing an optically anisotropic layer according to claim 2,
   wherein an irradiation amount of light irradiation in the step 3 is 300 mJ/cm$^2$ or less.

6. The method for producing an optically anisotropic layer according to claim 2,
   wherein the photosensitive chiral agent whose helical twisting power changes upon irradiation with light has a partial structure of any one of a binaphthyl partial structure, an isosorbide partial structure, or an isomannide partial structure.

7. The method for producing an optically anisotropic layer according to claim 2,
wherein the photosensitive chiral agent whose helical twisting power changes upon irradiation with light has a photoisomerizable double bond.

8. A method for producing a laminate, comprising laminating an optically anisotropic layer obtained by the production method according to claim 2 and a C-plate to obtain a laminate.

9. A method for producing an optically anisotropic layer with a polarizer, comprising laminating an optically anisotropic layer obtained by the production method according to claim 2 and a polarizer to obtain an optically anisotropic layer with a polarizer.

10. The method for producing an optically anisotropic layer according to claim 1,
wherein the absolute value of a weighted average helical twisting power of the two or more chiral agents in the composition layer in the step 1 is 0.0 to 0.5 $\mu m^{-1}$.

11. The method for producing an optically anisotropic layer according to claim 10,
wherein the optically anisotropic layer has, along a thickness direction, a first region in which the alignment state of the liquid crystal compound twist-aligned along a helical axis extending along a thickness direction is fixed, and a second region in which the alignment state of a homogeneously aligned liquid crystal compound is fixed.

12. The method for producing an optically anisotropic layer according to claim 1,
wherein an irradiation amount of light irradiation in the step 3 is 300 mJ/cm$^2$ or less.

13. The method for producing an optically anisotropic layer according to claim 1,
wherein the photosensitive chiral agent whose helical twisting power changes upon irradiation with light has a partial structure of any one of a binaphthyl partial structure, an isosorbide partial structure, or an isomannide partial structure.

14. The method for producing an optically anisotropic layer according to claim 1,
wherein the photosensitive chiral agent whose helical twisting power changes upon irradiation with light has a photoisomerizable double bond.

15. A method for producing a laminate, comprising laminating an optically anisotropic layer obtained by the production method according to claim 1 and a C-plate to obtain a laminate.

16. A method for producing an optically anisotropic layer with a polarizer, comprising laminating an optically anisotropic layer obtained by the production method according to claim 1 and a polarizer to obtain an optically anisotropic layer with a polarizer.

17. A method for producing a laminate with a polarizer, comprising laminating a laminate obtained by the production method according to claim 15 and a polarizer to obtain a laminate with a polarizer.

18. A composition comprising:
a chiral agent containing at least a photosensitive chiral agent whose helical twisting power changes upon irradiation with light; and
a liquid crystal compound having a polymerizable group,
wherein a total content of the chiral agent with respect to a total mass of the liquid crystal compound is 5.0% by mass or less, and
wherein the composition contains two or more chiral agents, and
an absolute value of a weighted average helical twisting power of the two or more chiral agents is 0.0 to 1.9 $\mu m^{-1}$.

19. The composition according to claim 18,
wherein the absolute value of a weighted average helical twisting power of the two or more chiral agents is 0.0 to 0.5 $\mu m^{-1}$.

20. An optically anisotropic layer formed of a liquid crystal compound,
wherein the optically anisotropic layer contains a leveling agent,
in a case where components of the optically anisotropic layer in a depth direction are analyzed by time-of-flight secondary ion mass spectrometry while irradiating the optically anisotropic layer with an ion beam from one surface to the other surface of the optically anisotropic layer, a profile of a secondary ion intensity derived from the leveling agent in a depth direction is obtained, a higher secondary ion intensity derived from the leveling agent, out of a secondary ion intensity derived from the leveling agent on the one surface of the optically anisotropic layer and a secondary ion intensity derived from the leveling agent on the other surface of the optically anisotropic layer, is defined as a first intensity, the secondary ion intensity which is $1/1000$ of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of $1/500$ or more of the first intensity is observed at any depth of a region between the first position and the second position, and
the optically anisotropic layer satisfies Requirement 1 or 2 given below,
Requirement 1: the optically anisotropic layer has, along a thickness direction, a region in which an alignment state of the liquid crystal compound twist-aligned along a helical axis extending along a thickness direction is fixed, and a region in which an alignment state of a homogeneously aligned liquid crystal compound is fixed,
Requirement 2: the optically anisotropic layer has, along a thickness direction, a plurality of regions in which the alignment state of the liquid crystal compound twist-aligned along a helical axis extending along a thickness direction is fixed, and twisted angles of liquid crystal compounds in the plurality of regions are different from each other.

* * * * *